US011892773B2

(12) United States Patent
Urano et al.

(10) Patent No.: US 11,892,773 B2
(45) Date of Patent: Feb. 6, 2024

(54) PHOTOSENSITIVE RESIN COMPOSITION, PATTERNING PROCESS, METHOD FOR FORMING CURED FILM, INTERLAYER INSULATION FILM, SURFACE PROTECTIVE FILM, AND ELECTRONIC COMPONENT

(71) Applicant: SHIN-ETSU CHEMICAL CO., LTD., Tokyo (JP)

(72) Inventors: Hiroyuki Urano, Joetsu (JP); Masashi Iio, Joetsu (JP); Katsuya Takemura, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 169 days.

(21) Appl. No.: 17/469,454

(22) Filed: Sep. 8, 2021

(65) Prior Publication Data

US 2022/0091509 A1 Mar. 24, 2022

(30) Foreign Application Priority Data

Sep. 24, 2020 (JP) ................. 2020-159730

(51) Int. Cl.
| G03F 7/075 | (2006.01) |
| G03F 7/004 | (2006.01) |
| G03F 7/16  | (2006.01) |
| G03F 7/40  | (2006.01) |
| G03F 7/38  | (2006.01) |
| G03F 7/023 | (2006.01) |

(52) U.S. Cl.
CPC .......... *G03F 7/0757* (2013.01); *G03F 7/0045* (2013.01); *G03F 7/16* (2013.01); *G03F 7/38* (2013.01); *G03F 7/40* (2013.01)

(58) Field of Classification Search
None
See application file for complete search history.

(56) References Cited

U.S. PATENT DOCUMENTS

| 2005/0020712 | A1* | 1/2005 | Baudin ...................... C08F 2/50 |
| | | | 522/184 |
| 2007/0026509 | A1* | 2/2007 | Rogers .................. G03F 7/0007 |
| | | | 522/904 |
| 2007/0202438 | A1 | 8/2007 | Takamuki |
| 2012/0052441 | A1 | 3/2012 | Sagehashi et al. |
| 2012/0237873 | A1 | 9/2012 | Fujiwara et al. |
| 2012/0301827 | A1* | 11/2012 | Hatanaka ................. G03F 7/40 |
| | | | 430/326 |
| 2013/0108963 | A1 | 5/2013 | Tanaka et al. |
| 2013/0209921 | A1 | 8/2013 | Qiu et al. |
| 2014/0113230 | A1 | 4/2014 | Kim et al. |
| 2014/0242516 | A1* | 8/2014 | Ogawa .................... C09D 183/08 |
| | | | 524/730 |
| 2015/0275042 | A1* | 10/2015 | Tsai ....................... C08K 5/3492 |
| | | | 524/100 |
| 2016/0313643 | A1 | 10/2016 | Ogawa et al. |
| 2018/0031970 | A1* | 2/2018 | Arimoto ............... G03F 7/0757 |
| 2019/0283406 | A1 | 9/2019 | Fujita et al. |

FOREIGN PATENT DOCUMENTS

| JP | 2003-255533 A | 9/2003 |
| JP | 2006-267401 A | 10/2006 |
| JP | 2007-199653 A | 8/2007 |
| JP | 2009-265268 A | 11/2009 |
| JP | 2012-037595 A | 2/2012 |
| JP | 2013-100480 A | 5/2013 |
| JP | 5609815 B2 | 10/2014 |
| JP | 2015-513690 A | 5/2015 |
| JP | 5987984 B2 | 9/2016 |

(Continued)

OTHER PUBLICATIONS

Nov. 25, 2022 Office Action and Search Report issued in Taiwanese Patent Application No. 110135059.
Feb. 21, 2022 Extended European Search Report issued in European Patent Application No. 21197201.3.
May 30, 2023 Office Action issued in Japanese Application No. 2020-159730.
Cosmetic Ingredients Online, "Basic Information, Purpose of Compounding, and Safety of PEG-11 Methyl Ether Dimethicone", searched on May 9, 2023, https://cosmetic-ingredients.org/surfactants-emulsifying-agents/15515.
Cosmetic Ingredients Online, "Basic Information, Purpose of Compounding, and Safety of PEG-3 Dimethicone", searched on May 9, 2023, https://cosmetic-ingredients.org/surfactants-emulsifying-agents/12982.

(Continued)

*Primary Examiner* — John S Chu
*Assistant Examiner* — Andrew Preston Traywick
(74) *Attorney, Agent, or Firm* — Oliff PLC

(57) ABSTRACT

A photosensitive resin composition, a patterning process performed using the photosensitive resin composition, a cured film formed by curing the pattern, and an electronic component having the cured film. The photosensitive resin composition includes a resin, a photosensitizer, a surfactant containing a structural unit represented by formula (1), and a solvent, where $Y_1$ and $Y_2$ each independently represent a hydrogen atom, a methyl group, a phenyl group, or a group represented by formula (2), at least one of $Y_1$ and $Y_2$ is a group represented by formula (2), $R_1$ to $R_6$ are monovalent hydrocarbon groups that may be the same or different and optionally contain a heteroatom, having 1 to 20 carbon atoms, "l" and "n" are each independently integers of 1 to 100, and "m" is an integer of 0 to 100.

$$(R_1R_2Y_2SiO)_{1/2})_2(R_3Y_1SiO_{2/2})_l(R_5R_6SiO_{2/2})_n(R_4SiO_{3/2})_m \quad (1)$$

$$\text{----}R_9\text{---}(\text{O---}R_{10})_a(\text{O---}R_{11})_b(\text{O---}R_{12})_c R_{14} \quad (2)$$
$$\quad\quad\quad\quad\quad\quad\quad\quad\quad\quad | $$
$$\quad\quad\quad\quad\quad\quad\quad\quad\quad (R_{13})_d$$

16 Claims, No Drawings

(56) References Cited

FOREIGN PATENT DOCUMENTS

| JP | 2017-044964 A | 3/2017 |
| JP | 2017-120346 A | 7/2017 |
| JP | 6414060 B2 | 10/2018 |
| JP | 2019-155837 A | 9/2019 |
| KR | 20130105422 A | 9/2013 |
| TW | 201131293 A | 9/2011 |
| TW | 201207561 A | 2/2012 |
| TW | I685513 B | 2/2020 |
| WO | 2007/097302 A1 | 8/2007 |
| WO | 2011/152058 A1 | 12/2011 |
| WO | 2015/060238 A1 | 4/2015 |
| WO | 2015/060240 A1 | 4/2015 |
| WO | 2016/140024 A1 | 9/2016 |
| WO | 2017/188153 A1 | 11/2017 |
| WO | 2018/117047 A1 | 6/2018 |

OTHER PUBLICATIONS

Momentive Performance Materials Inc., "CoatOSil* Additives for High Performance Coatings and Inks", 2017, searched on May 9, 2023, https://www.momentive.com/docs/default-source/productdocuments/coatosil-7001-copolymer/coatosil-additives-for-high-performance-coatings-and-inks.pdf.

Shin-Etsu Silicones, "Polyether-modified Silicone Oil", searched on May 9, 2023, https://www.silicone.jp/products/personalcare/products/polyether_modified_silicones.shtml.

Aug. 18, 2023 Office Action issued in Korean Application No. 10-1021-0123748.

* cited by examiner

PHOTOSENSITIVE RESIN COMPOSITION, PATTERNING PROCESS, METHOD FOR FORMING CURED FILM, INTERLAYER INSULATION FILM, SURFACE PROTECTIVE FILM, AND ELECTRONIC COMPONENT

TECHNICAL FIELD

The present invention relates to: a photosensitive resin composition; a patterning process; a method for forming a cured film; an interlayer insulation film; a surface protective film; and an electronic component.

BACKGROUND ART

As miniaturization and higher performance of various electronic devices such as personal computers, digital cameras, and mobile phones advance, a demand for further miniaturization, thinning and higher density in semiconductor devices are also increasing rapidly. With this increase, interlayer insulation films and surface protective films of semiconductor devices are required to have film thicknesses of various grades from thin films of 1 μm or less to thick films of 10 μm or more depending on usage, and a cured film formed by exposing and curing a photosensitive resin composition is sometimes used (Patent Document 1, Patent Document 2). In each film thickness, uniformity in film thickness is required on application of the photosensitive resin composition. However, these documents only propose a positive photosensitive resin composition and a negative photosensitive resin composition that use a fluorine-based surfactant, and have no description regarding the uniformity of film thickness.

In addition, when forming a thick film of 10 μm or more, the photosensitive resin composition becomes liable to incorporate bubbles when being applied since the photosensitive resin composition becomes highly viscous. Therefore, a problem sometimes occurs that coating defects are generated due to the bubbles. Patent Document 3 discloses a method for producing a composition containing an alkali-soluble resin, a photo-acid generator, a fluorine-based surfactant, and an organic solvent. It is proposed that the surfactant and the organic solvent be mixed first, and then the alkali-soluble resin and the photo-acid generator be added to the mixed solution in order to improve the dispersibility of the surfactant so that repellence defects at the time of application are reduced. However, evaluation is conducted only with film thicknesses of less than 10 μm in this document, and there is no description regarding coating defects caused by bubbles when forming thick films. As described, film thickness uniformity on application and reduction of defects are often given as problems, and improvement thereof is strongly desired.

CITATION LIST

Patent Literature

Patent Document 1: WO 2015/060238
Patent Document 2: WO 2015/060240
Patent Document 3: WO 2011/152058

SUMMARY OF INVENTION

Technical Problem

The present invention has been made in view of the above-described circumstances, and an object thereof is to provide a photosensitive resin composition that is excellent in film thickness uniformity at the time of application and that has reduced coating defects when forming a thick film. Another object of the present invention is to provide: a patterning process performed using the photosensitive resin composition; a cured film formed by curing the pattern; and an electronic component having the cured film.

Solution to Problem

To solve the above-described problems, the present invention provides a photosensitive resin composition comprising:
(A) a resin;
(B) a photosensitizer;
(C) a surfactant comprising a structural unit represented by the following average composition formula (1); and
(D) a solvent,

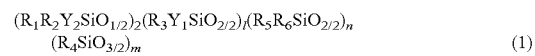

wherein $Y_1$ and $Y_2$ each independently represent a hydrogen atom, a methyl group, a phenyl group, or a group represented by the following general formula (2), at least one of $Y_1$ and $Y_2$ is a group represented by the following general formula (2), $R_1$ to $R_6$ are monovalent hydrocarbon groups that may be the same or different and optionally contain a heteroatom, having 1 to 20 carbon atoms, "l" and "n" are each independently integers of 1 to 100, and "m" is an integer of 0 to 100,

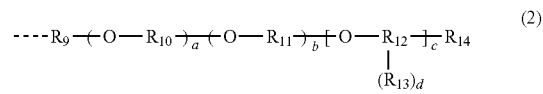

wherein a dotted line represents a bond, $R_9$, $R_{10}$, and $R_{11}$ each independently represent a linear or branched alkylene group having 2 to 10 carbon atoms where $R_{10}$ is different from $R_{11}$, $R_{12}$ represents a trivalent hydrocarbon group having 2 to 10 carbon atoms, $R_{13}$ represents a structure having one or more repeating units selected from ($OR_{10}$), ($OR_{11}$), and ($OR_{12}$), $R_{14}$ represents a hydroxy group, a linear or branched alkyl group having 1 to 10 carbon atoms, a linear or branched alkyl ether group having 1 to 10 carbon atoms, a linear or branched unsaturated alkyl ether group having 1 to 10 carbon atoms, or a linear or branched alkyl ester group having 1 to 10 carbon atoms, "a" represents an integer of 1 to 50, "b" represents an integer of 0 to 50, "c" represents an integer of 0 to 50, "d" represents an integer of 1 to 20; and —$OR_{10}$—, —$OR_{11}$—, and —$OR_{12}(R_{13})$— may be in a random order.

Such a photosensitive resin composition is excellent in film thickness uniformity on application, and has reduced coating defects on formation of a thick film.

Furthermore, "a" preferably represents an integer of 10 to 30, "b" preferably represents an integer of 10 to 30, and "c" preferably represents an integer of 0 to 20 in the general formula (2).

Such a photosensitive resin composition has sufficient solubility to a solvent, has appropriate balance with a siloxane structure, improves film thickness uniformity on application, and can improve antifoaming properties on formation of a thick film.

Furthermore, $R_{14}$ in the general formula (2) preferably represents a linear or branched alkyl ester group having 1 to 10 carbon atoms.

Such a photosensitive resin composition can further improve the advantageous effects of the present invention.

In addition, the inventive photosensitive resin composition preferably further comprises (E) one or more crosslinking agents selected from an amino condensate modified by formaldehyde or formaldehyde-alcohol; a phenol compound having two or more methylol groups or alkoxymethylol groups by average in one molecule; a compound in which a hydrogen atom of a hydroxy group of a polyvalent phenol is substituted with a glycidyl group; a compound in which a hydrogen atom of a hydroxy group of a polyvalent phenol is substituted with a substituent represented by the following formula (E-1); and a compound containing two or more nitrogen atoms having a glycidyl group represented by the following formula (E-2),

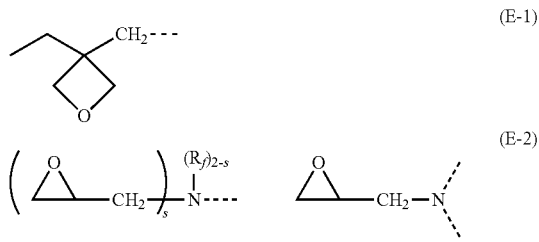

wherein a dotted line represents a bond, $R_f$ represents a linear, branched or cyclic alkyl group having 1 to 6 carbon atoms, and "s" represents 1 or 2.

With such a photosensitive resin composition, strength of a cured material can be further raised.

Furthermore, the resin (A) is preferably at least one kind selected from polyamide, polyamide-imide, polyimide, a polyimide precursor, polybenzoxazole, a polybenzoxazole precursor, and a resin containing a siloxane skeleton.

Such a resin is suitable as the resin (A).

Furthermore, the resin preferably has a weight-average molecular weight of 3,000 to 500,000.

Such a photosensitive resin composition makes it easy to form a film on a substrate at a desired film thickness, and also has suitable viscosity.

Furthermore, the photosensitizer (B) is preferably a photo-acid generator.

As a positive photosensitive resin composition, such a photosensitive resin composition does not dissolve in the developer in unexposed portions and is soluble to the developer in exposed portions even when an alkaline aqueous solution is used as a developer, so that a favorable positive pattern can be formed. As a negative photosensitive resin composition, a favorable negative pattern can be formed by a crosslinking group of the component (E) being crosslinked with the resin of the component (A) with an acid generated from the component (B) as a catalyst.

Furthermore, the photo-acid generator can be a compound having a quinonediazide structure.

In particular, a positive pattern can be formed more efficiently with such a photo-acid generator.

Furthermore, the photosensitizer (B) can be a photoradical initiator.

The inventive photosensitive resin composition can contain such a photosensitizer.

In addition, the present invention provides a patterning process comprising:

(I) forming a photosensitive material film by coating a substrate with the above-described photosensitive resin composition;

(II) subsequently, after a heat treatment, exposing the photosensitive material film with a high-energy beam having a wavelength of 190 to 500 nm or an electron beam via a photomask; and (III) developing with a developer of an alkaline aqueous solution or an organic solvent.

A film having a desired pattern can be obtained according to such a patterning process.

Furthermore, the patterning process preferably further comprises a heating step after the exposure between the exposure step and the development step.

When the inventive patterning process includes such a step, it is possible to promote a crosslinking reaction between the crosslinking group of the crosslinking agent and the crosslinking reaction point of the polymer by using, as a catalyst, an acid generated from the photo-acid generator by the exposure.

In addition, the present invention provides a method for forming a cured film comprising:

further heating and post-curing, at a temperature of 100 to 300° C., a film on which a pattern is formed by the patterning process.

Such a method for forming a cured film can raise the crosslinking density of the photosensitive resin composition film and remove residual volatile components, and is favorable in view of adhesive force to the substrate, heat resistance, strength, and also electric characteristics.

In addition, the present invention provides an interlayer insulation film or a surface protective film, being a cured film of the photosensitive resin composition.

Such an interlayer insulation film or surface protective film is excellent in adhesiveness to a substrate, heat resistance, electric characteristics, mechanical strength, and chemical resistance to an alkaline peeling solution and the like. Moreover, a semiconductor device that uses the cured film as a protective film also has excellent reliability. Particularly, it is possible to prevent cracks in a temperature cycle test.

In addition, the present invention provides an electronic component having the above-described interlayer insulation film or surface protective film.

Such an electronic component has excellent reliability since the electronic component has a protective film (interlayer insulation film or surface protective film) having heat resistance, chemical resistance, and insulating property.

Advantageous Effects of Invention

As described above, according to the present invention, it is possible to provide a photosensitive resin composition that is excellent in film thickness uniformity at the time of application and that has reduced coating defects when forming a thick film. In addition, it is also possible to provide: a patterning process performed using the photosensitive resin composition; a cured film formed by curing the pattern; and an electronic component having the cured film.

DESCRIPTION OF EMBODIMENTS

As described above, development of a photosensitive resin composition excellent in film thickness uniformity on application and with reduced coating defects on formation of a thick film, a patterning process performed using the photosensitive resin composition, a cured film formed by curing the pattern, and an electronic component having the cured film has been desired.

To achieve the object, the present inventors have earnestly studied, and found out that a photosensitive resin composition containing (A) a resin, (B) a photosensitizer, (C) a surfactant containing a nonionic organosiloxane compound having a polyoxyalkylene group in a side chain and/or a terminal, and (D) a solvent has excellent film thickness uniformity on application and can reduce coating defects on thick film formation. Thus, the present invention has been completed.

That is, the present invention is a photosensitive resin composition comprising:
(A) a resin;
(B) a photosensitizer;
(C) a surfactant comprising a structural unit represented by the following average composition formula (1); and
(D) a solvent,

$(R_5R_6SiO_{2/2})_n(R_4SiO_{3/2})_m$   (1)

wherein $Y_1$ and $Y_2$ each independently represent a hydrogen atom, a methyl group, a phenyl group, or a group represented by the following general formula (2), at least one of $Y_1$ and $Y_2$ is a group represented by the following general formula (2), $R_1$ to $R_6$ are monovalent hydrocarbon groups that may be the same or different and optionally contain a heteroatom, having 1 to 20 carbon atoms, "l" and "n" are each independently integers of 1 to 100, and "m" is an integer of 0 to 100,

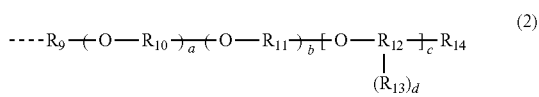

wherein a dotted line represents a bond, $R_9$, $R_{10}$, and $R_{11}$ each independently represent a linear or branched alkylene group having 2 to 10 carbon atoms where $R_{10}$ is different from $R_{11}$, $R_{12}$ represents a trivalent hydrocarbon group having 2 to 10 carbon atoms, $R_{13}$ represents a structure having one or more repeating units selected from $(OR_{10})$, $(OR_{11})$, and $(OR_{12})$, $R_{14}$ represents a hydroxy group, a linear or branched alkyl group having 1 to 10 carbon atoms, a linear or branched alkyl ether group having 1 to 10 carbon atoms, a linear or branched unsaturated alkyl ether group having 1 to 10 carbon atoms, or a linear or branched alkyl ester group having 1 to 10 carbon atoms, "a" represents an integer of 1 to 50, "b" represents an integer of 0 to 50, "c" represents an integer of 0 to 50, "d" represents an integer of 1 to 20; and —$OR_{10}$—, —$OR_{11}$—, and —$OR_{12}(R_{13})$— may be in a random order.

The inventive photosensitive resin composition has excellent film thickness uniformity at the time of application, and coating defects at the time of thick film formation can be reduced.

Hereinafter, the present invention will be described in detail, but the present invention is not limited thereto.
[(A) Resin]
The resin (A) is a resin to be a base of the inventive photosensitive resin composition, and it is possible to select a positive photosensitive resin composition or a negative photosensitive resin composition depending on the mechanical characteristics, optical characteristics, and so forth required in the cured film formed from the photosensitive resin composition using the resin. The resin is preferably selected from polyamide, polyamide-imide, polyimide, a polyimide precursor, polybenzoxazole, a polybenzoxazole precursor, and a resin containing a siloxane skeleton, and one kind may be used or two or more kinds may be used in combination.

(Polyamide, Polyamide-Imide, Polyimide, Polyimide Precursor, Polybenzoxazole, and Polybenzoxazole Precursor)

The resin preferably contains at least one structural unit selected from the structural units represented by the following general formulae (3), (4), (5), and (7).

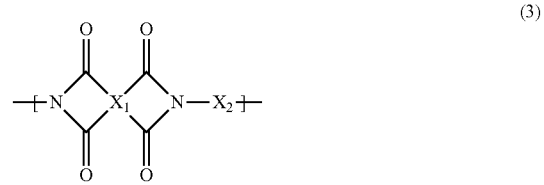

In the formula, $X_1$ represents a tetravalent organic group, and $X_2$ represents a divalent organic group.

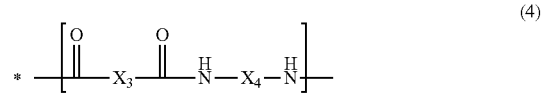

In the formula, $X_3$ represents a divalent organic group, and $X_4$ represents a divalent organic group that is the same as or different from the above $X_2$.

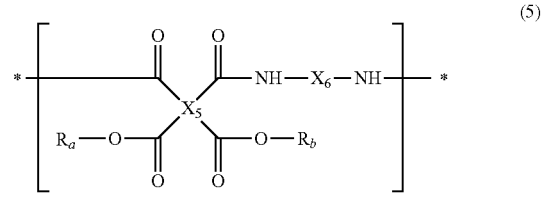

In the formula, $X_5$ represents a tetravalent organic group that is the same as or different from the above $X_1$, $X_6$ represents a divalent organic group that is the same as or different from the above $X_2$, and $R_a$ and $R_b$ each independently represent a hydrogen atom, an organic group having 1 to 10 carbon atoms optionally containing an intervening heteroatom and optionally having a substituent, or an organic group shown by the following general formula (6).

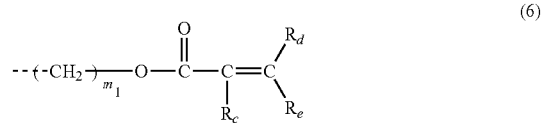

In the formula, a dotted line represents a bond. $R_c$ represents a hydrogen atom or an organic group having 1 to 3 carbon atoms, $R_d$ and $R_e$ each independently represent a hydrogen atom or an organic group having 1 to 3 carbon atoms, and $m_1$ represents an integer of 2 to 10.

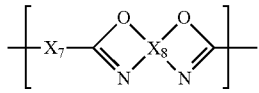
(7)

In the formula, $X_7$ represents a divalent organic group that is the same as or different from the above $X_3$, and $X_8$ represents a tetravalent organic group.

The $X_1$ in the general formula (3) is a tetravalent organic group, and is not limited as long as it is a tetravalent organic group. $X_1$ preferably represents a tetravalent organic group of an alicyclic aliphatic group having 4 to 40 carbon atoms, a tetravalent organic group of an aromatic group, or a tetravalent organic group containing a siloxane skeleton; further preferably a tetravalent organic group represented by the following formula (8). In addition, the structure of $X_1$ may be one kind or may be a combination of two or more kinds.

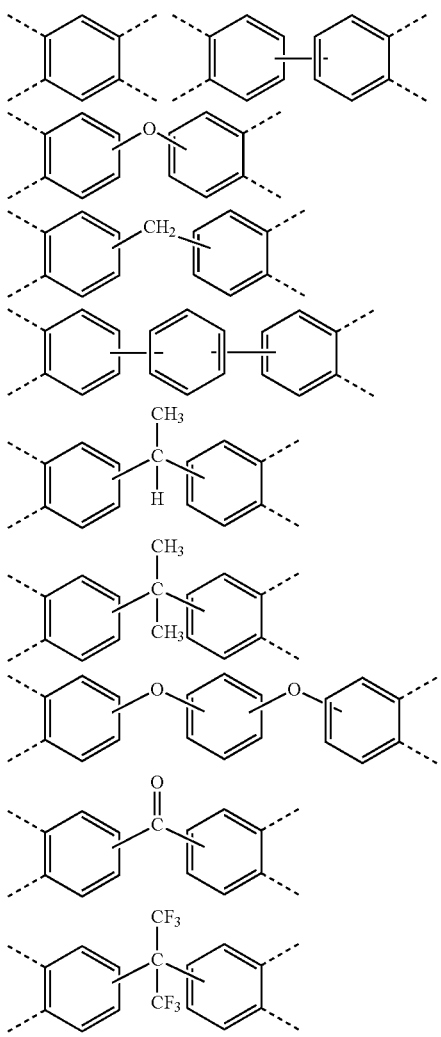
(8)

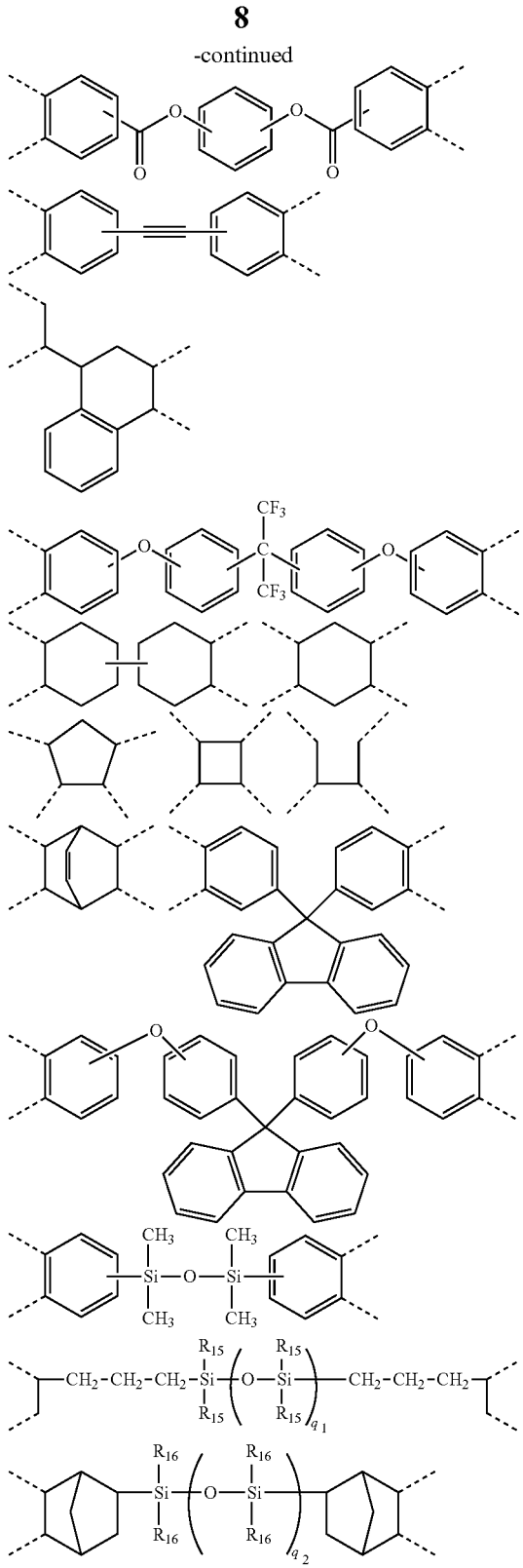

In the formulae, $R_{15}$ and $R_{16}$ each independently represent a methyl group or a phenyl group, $q_1$ and $q_2$ represent an integer of 1 to 20, and a dotted line represents a bond.

The $X_2$ in the general formula (3) represents a divalent organic group, and is not limited as long as it is a divalent organic group. However, $X_2$ preferably represents a divalent organic group having 6 to 40 carbon atoms, and more preferably a cyclic organic group containing 1 to 4 aromatic rings or aliphatic rings having a substituent, or an aliphatic group or siloxane group having no cyclic structure. Examples of further suitable $X_2$s include structures shown by the following formula (9), (10) or (11). Furthermore, the structure of $X_2$ may be one kind or may be a combination of two or more kinds.

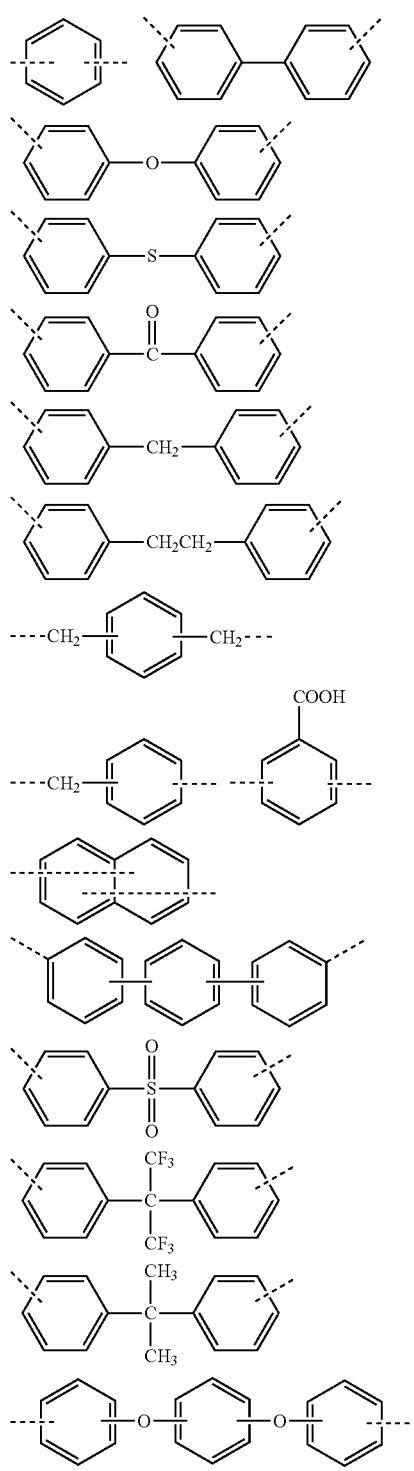

(9)

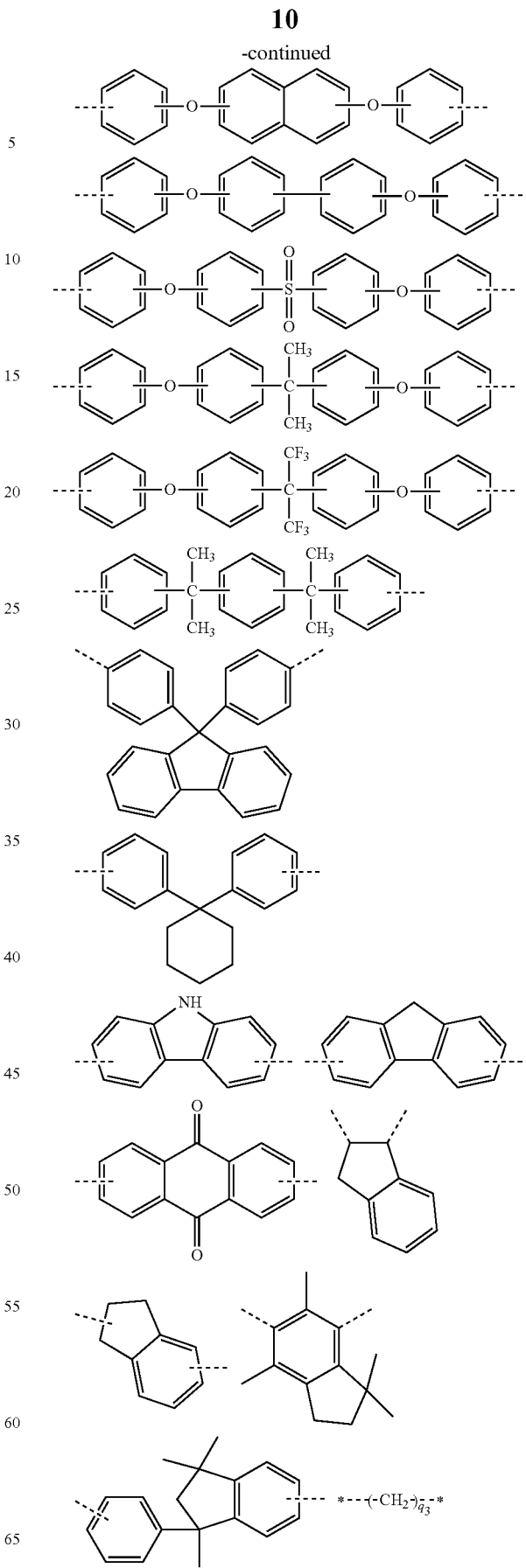

-continued

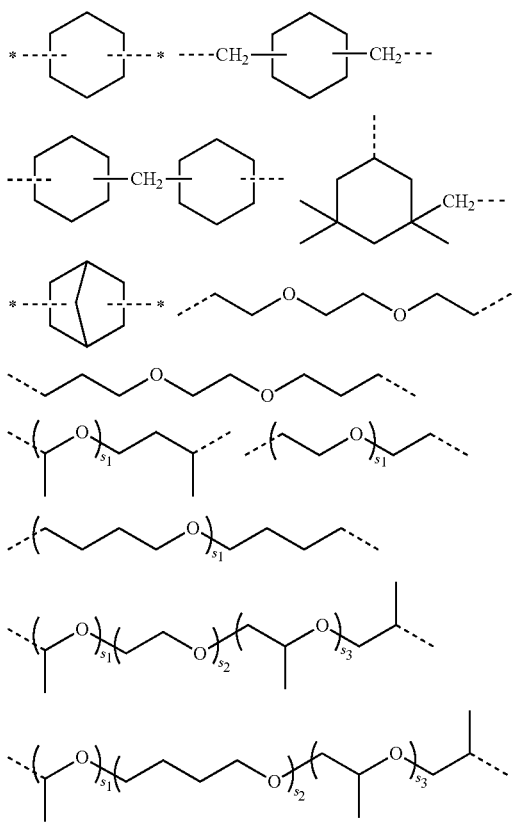

In the formulae, $q_3$ represents an integer of 1 to 20, $s_1$ represents an integer of 1 to 40, $s_2$ and $s_3$ each independently represent an integer of 0 to 40, and a dotted line represents a bond.

(10)

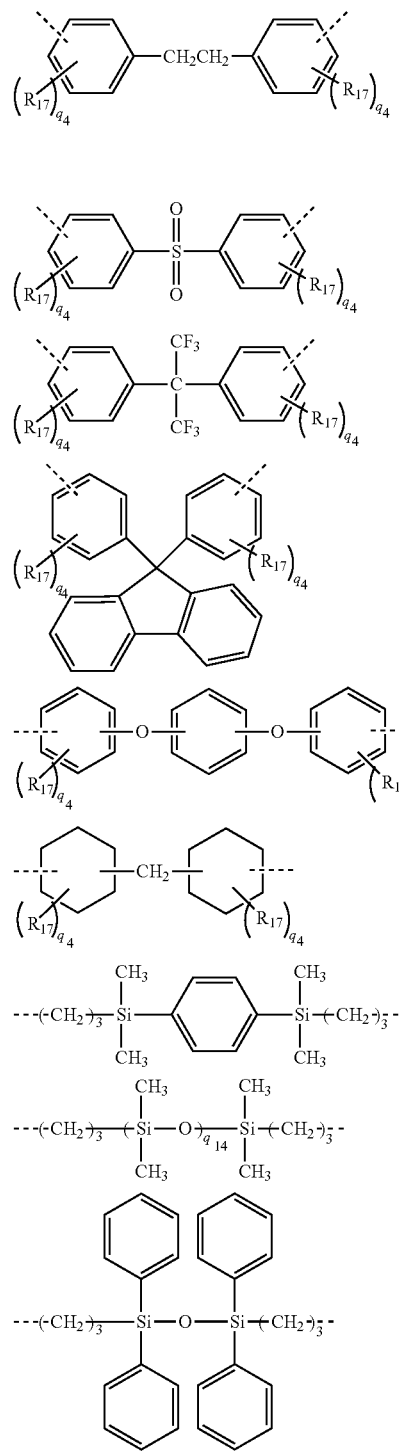

In the formulae, $q_4$ represents an integer of 1 to 4, $q_{14}$ represents an integer of 1 to 20, $R_{17}$ represents a fluorine atom, a methyl group, an ethyl group, a propyl group, an n-butyl group, a methoxy group, an ethoxy group, a propoxy group, a butoxy group, or a trifluoromethyl group, and when $q_4$ is 2 or more, $R_{17}$ may be the same as or different from each other. A dotted line represents a bond.

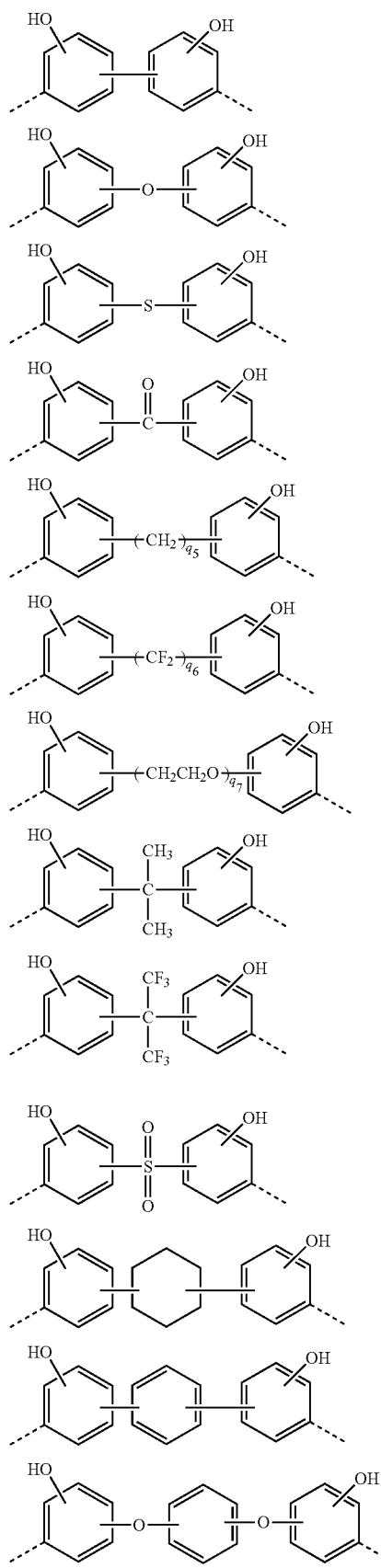

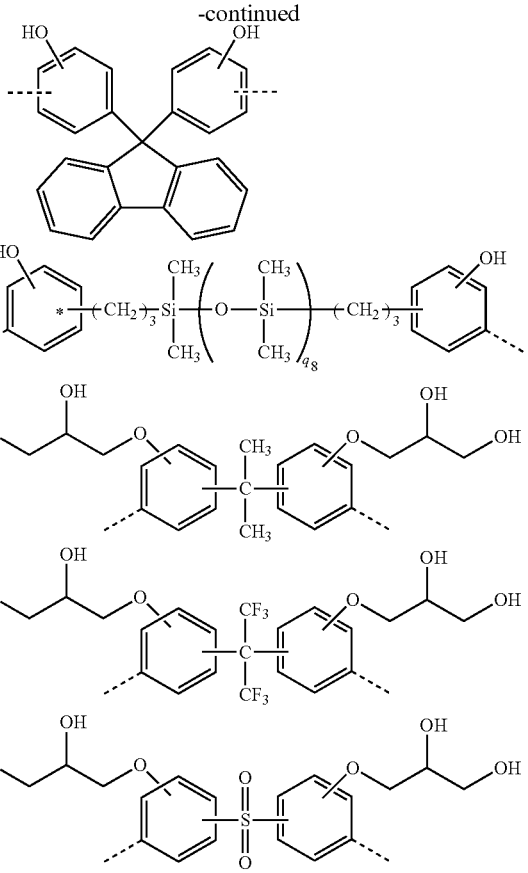

In the formulae, $q_5$, $q_6$, and $q_7$ each represent an integer of 1 to 10, $q_8$ represents an integer of 1 to 20, and a dotted line represents a bond.

A resin containing the structural unit shown by the general formula (3) is preferable since it is possible to improve the mechanical strength, adhesive force to a substrate, and heat resistance of an obtained cured film with a pattern formed. In addition, the structural unit (3) is preferable because it is not necessary to perform a ring-closing reaction in post-curing, and it is possible to lower the curing reaction temperature relatively.

The $X_3$ in the general formula (4) represents a divalent organic group, and is not limited as long as it is a divalent organic group. Preferably, $X_3$ is a divalent organic group of an aliphatic chain length structure or an alicyclic aliphatic group having 4 to 40 carbon atoms, or an aromatic group. Further preferably, $X_3$ is a divalent organic group represented by the following formula (12). Furthermore, the structure of $X_3$ may be one kind or a combination of two or more kinds.

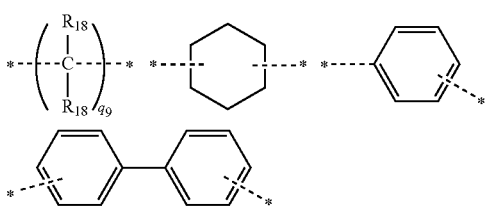

-continued

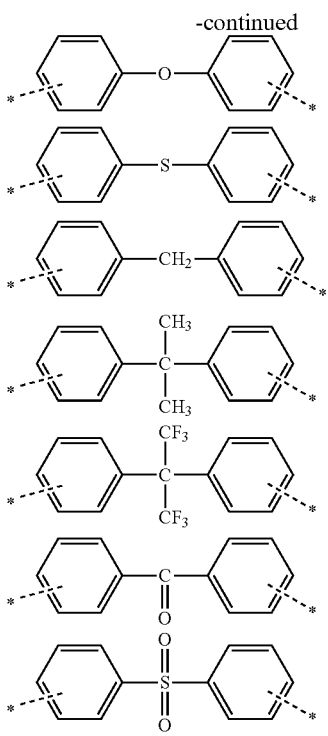

In the formulae, $R_{18}$ each independently represents a hydrogen atom, a fluorine atom, or an alkyl group having 1 to 6 carbon atoms, $q_9$ is an integer of 1 to 30, and a dotted line represents a bond.

The $X_4$ in the general formula (4) is a divalent organic group, can be the same as or different from the above-described $X_2$, and is not limited as long as it is a divalent organic group. $X_4$ is preferably a divalent organic group having 6 to 40 carbon atoms, and is a cyclic organic group containing 1 to 4 aromatic rings or aliphatic rings having a substituent, or an aliphatic group or siloxane group having no cyclic structure. Further preferable examples of $X_4$ include the structures shown by the formula (9), (10), or (11). Furthermore, the structure of $X_4$ may be one kind or a combination of two or more kinds.

A resin containing the structural unit shown by the general formula (4) is preferable since it is possible to improve mechanical characteristics such as elongation and adhesive force of a cured film obtained with a formed pattern to a substrate.

The $X_5$ in the general formula (5) is a tetravalent organic group, can be the same as or different from the above-described $X_1$, and is not limited as long as it is a tetravalent organic group. $X_5$ is preferably a tetravalent organic group of an alicyclic aliphatic group having 4 to 40 carbon atoms, a tetravalent organic group of an aromatic group, or a tetravalent organic group containing a siloxane skeleton, and further preferably a tetravalent organic group shown by the formula (8). Furthermore, the structure of $X_5$ may be one kind or a combination of two or more kinds.

The $X_6$ in the general formula (5) is a divalent organic group, can be the same as or different from the above-described $X_2$, and is not limited as long as it is a divalent organic group. $X_6$ is preferably a divalent organic group having 6 to 40 carbon atoms, and is a cyclic organic group containing 1 to 4 aromatic rings or aliphatic rings having a substituent, or an aliphatic group or siloxane group having no cyclic structure. Further preferable examples of $X_6$ include the structures shown by the formula (9), (10), or (11). Furthermore, the structure of $X_6$ may be one kind or a combination of two or more kinds.

The $R_a$ and $R_b$ in the general formula (5) each independently represent a hydrogen atom, an organic group having 1 to 10 carbon atoms optionally containing an intervening heteroatom and optionally substituted with a halogen atom, or an organic group shown by the general formula (6). One or both of $R_a$ and $R_b$ are preferably an organic group shown by the general formula (6).

$R_c$ in the general formula (6) represents a hydrogen atom or an organic group having 1 to 3 carbon atoms, $R_d$ and $R_e$ each independently represent a hydrogen atom or an organic group having 1 to 3 carbon atoms, and $m_1$ represents an integer of 2 to 10. $R_c$ is preferably a hydrogen atom or a methyl group, $R_d$ and $R_e$ preferably represent a hydrogen atom, and $m_1$ is preferably an integer of 2 to 5.

When such a material is employed, since it has a polymerizable unsaturated bonding group in the structural unit, by combining with a photoradical initiator mentioned below, radical polymerization proceeds using the radicals generated in the exposed portion in pattern formation as initiators, the material has characteristics that it becomes insoluble in a developer, so that a negative photosensitive resin composition can be provided without newly adding a crosslinking agent.

The $X_7$ in the general formula (7) is a divalent organic group, may be the same as or different from the above-described $X_3$, and is not limited as long as it is a divalent organic group. Preferably, $X_7$ is a divalent organic group of an aliphatic chain length structure or an alicyclic aliphatic group having 4 to 40 carbon atoms, or an aromatic group. Further preferably, $X_7$ is a divalent organic group shown by the formula (12). Furthermore, the structure of $X_7$ may be one kind or a combination of two or more kinds.

The $X_8$ in the general formula (7) is a tetravalent organic group, and is not limited as long as it is a tetravalent organic group. However, $X_8$ is preferably a divalent organic group having 6 to 40 carbon atoms, and more preferably a cyclic organic group containing 1 to 4 aromatic rings or aliphatic rings having a substituent, or an aliphatic group or siloxane group having no cyclic structure. Examples of further suitable $X_8$s include structures shown by the following formulae (13). Furthermore, the structure of $X_8$ may be one kind or a combination of two or more kinds.

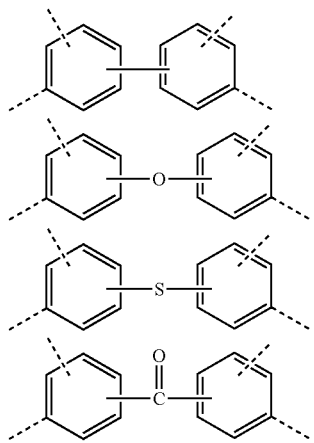

(13)

-continued

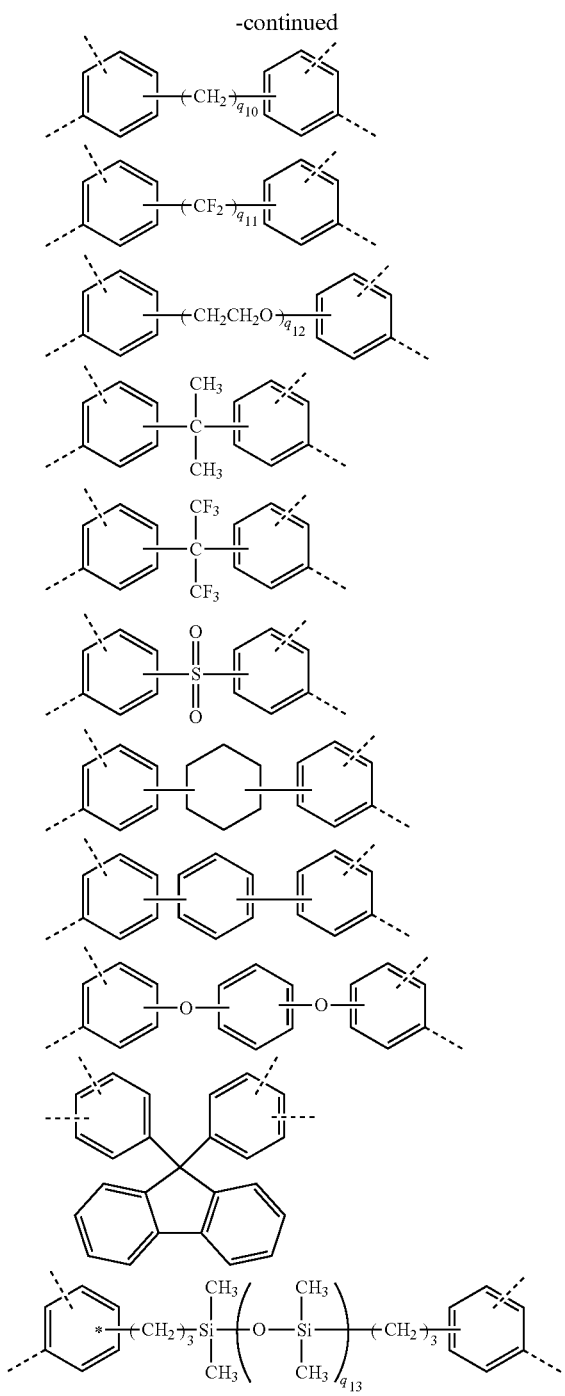

In the formulae, $q_{10}$, $q_{11}$, and $q_{12}$ each represent an integer of 1 to 10, $q_{13}$ represents an integer of 1 to 20, and a dotted line represents a bond.

A resin containing the structural unit shown by the general formula (7) is preferable since it is possible to improve the mechanical strength, adhesive force to a substrate, and heat resistance of an obtained cured film with a pattern formed. In addition, the structural unit (7) is preferable because it is not necessary to perform a ring-closing reaction in post-curing, and it is possible to lower the curing reaction temperature relatively.

A suitable weight-average molecular weight for the above-described polyamide, polyamide-imide, polyimide, polyimide precursor, polybenzoxazole, and polybenzoxazole precursor is preferably 3,000 to 500,000, more preferably 5,000 to 100,000, and further preferably 7,000 to 50,000. When the weight-average molecular weight is 3,000 or more, it becomes easier to form, on a substrate, a film of the photosensitive resin composition which uses the above-described resin as a base resin at a desired film thickness. When the weight-average molecular weight is 500,000 or less, the photosensitive resin composition does not become considerably viscous, so that there is no risk of it becoming impossible to form a film. Note that in the present invention, the weight-average molecular weight is determined by gel permeation chromatography (GPC) in terms of polystyrene.

(Resin Containing Siloxane Skeleton)

The resin preferably contains a structural unit represented by the following general formula (14).

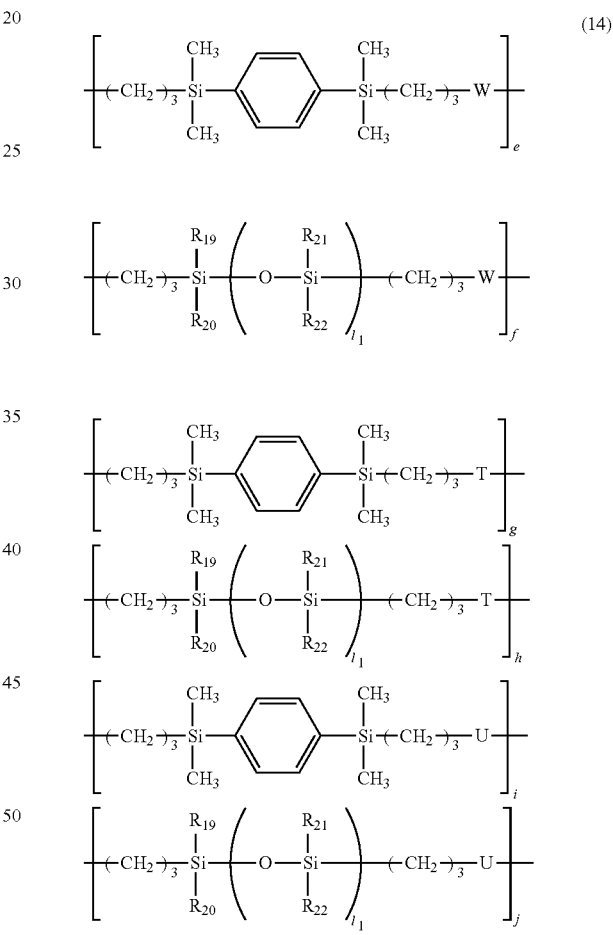

In the formulae, $R_{19}$ to $R_{22}$ may be the same or different, and represent a monovalent hydrocarbon group having 1 to 20 carbon atoms and optionally containing a heteroatom. $l_1$ each independently represents an integer of 1 to 100. "e" and "f" are positive numbers and "g", "h", "i", and "j" are 0 or a positive number, where e+f+g+h+i+j=1. W represents an organic group represented by the following general formula (15), T represents an organic group represented by the following general formula (16), and U represents an organic group represented by the following general formula (17) and/or (18).

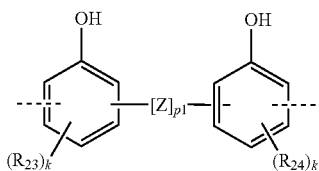
(15)

In the formula, Z represents a divalent organic group selected from

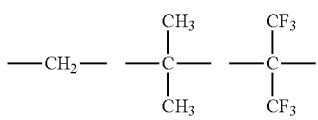

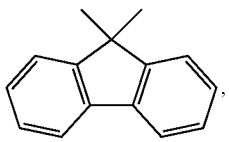

and $p_1$ represents 0 or 1. $R_{23}$ and $R_{24}$ each represent an alkyl group or an alkoxy group having 1 to 4 carbon atoms, and may be different from or the same as each other. "k" represents one of 0, 1, or 2, and a dotted line represents a bond.

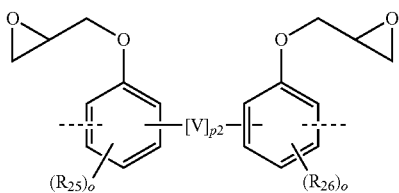
(16)

In the formula, V represents a divalent organic group selected from

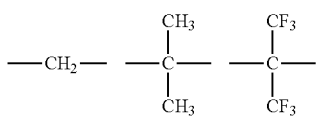

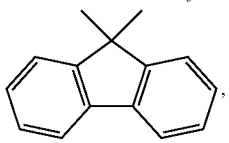

and $p_2$ represents 0 or 1. $R_{25}$ and $R_{26}$ each represent an alkyl group or an alkoxy group having 1 to 4 carbon atoms, and may be different from or the same as each other. "o" represents one of 0, 1, or 2, and a dotted line represents a bond.

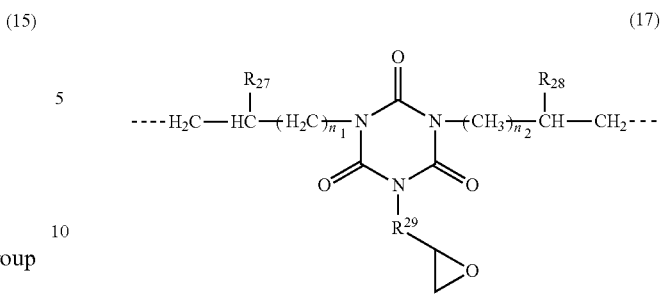
(17)

In the formula, $R_{27}$ and $R_{28}$ each independently represent a hydrogen atom or a methyl group. $n_1$ and $n_2$ each independently represent an integer of 0 to 7. $R_{29}$ represents a divalent hydrocarbon group having 1 to 8 carbon atoms, and the carbon atoms are optionally interposed by an ester bond or an ether bond. A dotted line represents a bond.

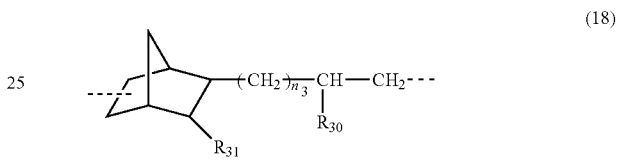
(18)

In the formula, $R_{30}$ and $R_{31}$ each independently represent a hydrogen atom or an alkyl group having 1 to 20 carbon atoms and optionally containing a heteroatom. $n_3$ represents an integer of 0 to 10, and a dotted line represents a bond.

In the general formula (14), $R_{19}$ to $R_{22}$ may be the same as or different from each other, and each represent a monovalent hydrocarbon group having 1 to 20 carbon atoms and optionally containing a heteroatom.

The monovalent hydrocarbon group can be linear, branched, or cyclic, and specific examples thereof include monovalent aliphatic hydrocarbon groups such as alkyl groups having 1 to 20 carbon atoms and alkenyl groups having 2 to 20 carbon atoms; and monovalent aromatic hydrocarbon groups such as aryl groups having 6 to 20 carbon atoms and aralkyl groups having 7 to 20 carbon atoms.

Examples of the alkyl groups include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, a cyclopentyl group, an n-hexyl group, a cyclohexyl group, an n-heptyl group, an n-octyl group, an n-nonyl group, an n-decyl group, a norbornyl group, an adamantyl group, etc. Examples of the alkenyl groups include a vinyl group, a propenyl group, a butenyl group, a pentenyl group, etc.

Furthermore, the monovalent aliphatic hydrocarbon groups may contain a heteroatom. Specifically, some or all of the hydrogen atoms of the monovalent aliphatic hydrocarbon group may be substituted with a halogen atom or the like such as a fluorine atom, a chlorine atom, a bromine atom, and an iodine atom. The carbon atoms of the group are optionally interposed by a carbonyl group, an ether bond, a thioether bond, etc. Examples of such monovalent aliphatic hydrocarbon groups containing a heteroatom include a 2-oxocyclohexyl group and the like.

Examples of the aryl groups include a phenyl group, a 2-methylphenyl group, a 3-methylphenyl group, a 4-methylphenyl group, a 2-ethylphenyl group, a 3-ethylphenyl group, a 4-ethylphenyl group, a 4-tert-butylphenyl group, a 4-butylphenyl group, a dimethylphenyl group, a naphthyl group, a biphenylyl group, a terphenyl group, etc. Examples of the aralkyl groups include a benzyl group, a phenethyl group, etc.

In addition, the monovalent aromatic hydrocarbon groups may contain a heteroatom. Specifically, some or all of the hydrogen atoms of the monovalent aromatic hydrocarbon group may be substituted with an alkoxy group having 1 to 10 carbon atoms, an alkylthio group having 1 to 10 carbon atoms, an aryloxy group having 6 to 20 carbon atoms, an arylthio group having 6 to 20 carbon atoms, etc.

Examples of the alkoxy group having 1 to 10 carbon atoms include a methoxy group, an ethoxy group, an n-propyloxy group, an isopropyloxy group, a cyclopropyloxy group, an n-butyloxy group, an isobutyloxy group, a sec-butyloxy group, a tert-butyloxy group, a cyclobutyloxy group, an n-pentyloxy group, a cyclopentyloxy group, an n-hexyloxy group, a cyclohexyloxy group, an n-heptyloxy group, an n-octyloxy group, an n-nonyloxy group, an n-decyloxy group, a norbornyloxy group, an adamantyloxy group, etc.

Examples of the alkylthio group having 1 to 10 carbon atoms include a methylthio group, an ethylthio group, an n-propylthio group, an isopropylthio group, a cyclopropylthio group, an n-butylthio group, an isobutylthio group, a sec-butylthio group, a tert-butylthio group, a cyclobutylthio group, an n-pentylthio group, a cyclopentylthio group, an n-hexylthio group, a cyclohexylthio group, an n-heptylthio group, an n-octylthio group, an n-nonylthio group, an n-decylthio group, a norbornylthio group, an adamantylthio group, etc.

Examples of the aryloxy group having 6 to 20 carbon atoms include a phenyloxy group, a 2-methylphenyloxy group, a 3-methylphenyloxy group, a 4-methylphenyloxy group, a 2-ethylphenyloxy group, a 3-ethylphenyloxy group, a 4-ethylphenyloxy group, a 4-tert-butylphenyloxy group, a 4-butylphenyloxy group, a dimethylphenyloxy group, a naphthyloxy group, a biphenylyloxy group, a terphenyloxy group, etc.

Examples of the arylthio group having 6 to 20 carbon atoms include a phenylthio group, a 2-methylphenylthio group, a 3-methylphenylthio group, a 4-methylphenylthio group, a 2-ethylphenylthio group, a 3-ethylphenylthio group, a 4-ethylphenylthio group, a 4-tert-butylphenylthio group, a 4-butylphenylthio group, a dimethylphenylthio group, a naphthylthio group, a biphenylylthio group, a terphenylylthio group, etc.

Examples of aromatic hydrocarbon groups substituted with these groups include a 2-methoxyphenyl group, a 3-methoxyphenyl group, a 4-methoxyphenyl group, a 2-ethoxyphenyl group, a 3-ethoxyphenyl group, a 4-ethoxyphenyl group, a 3-tert-butoxyphenyl group, a 4-tert-butoxyphenyl group, a 2-methoxyphenethyl group, a 3-methoxyphenethyl group, a 4-methoxyphenethyl group, a 2-ethoxyphenethyl group, a 3-ethoxyphenethyl group, a 4-ethoxyphenethyl group, a biphenylyloxyphenyl group, a biphenylylthiophenyl group, etc.

The monovalent aliphatic hydrocarbon group preferably has 1 to 10 carbon atoms, more preferably 1 to 8. Meanwhile, the monovalent aromatic hydrocarbon group preferably has 6 to 14 carbon atoms, more preferably 6 to 10.

Among these, as $R_{19}$ to $R_{22}$, a methyl group, an ethyl group, an n-propyl group, or a phenyl group is preferable, and a methyl group or a phenyl group is more preferable.

In the general formula (14), each $l_1$ is independently an integer of 1 to 100, and is preferably an integer of 1 to 50.

In addition, from the viewpoints of adhesiveness to a substrate, electric characteristics, reliability, and light resistance, "e" and "f" in the general formula (14) are positive numbers, and "g", "h", "i", and "j" are 0 or positive numbers. In this case, preferably $0<e\leq0.8$, more preferably $0.2\leq e\leq0.8$; preferably $0<f\leq0.8$, more preferably $0.2\leq f\leq0.8$; preferably $0\leq g\leq0.3$, more preferably $0\leq g\leq0.2$; preferably $0\leq h\leq0.3$, more preferably $0\leq h\leq0.2$; preferably $0<i\leq0.8$, more preferably $0<i\leq0.5$; and preferably $0<j\leq0.8$, more preferably $0<j\leq0.5$. Here, $e+f+g+h+i+j=1$.

In the general formula (15), $R_{23}$ and $R_{24}$ each represent an alkyl group or an alkoxy group having 1 to 4 carbon atoms, and may be different from or the same as each other. Specific examples of $R_{23}$ and $R_{24}$ include a methyl group, an ethyl group, an isopropyl group, a tert-butyl group, a methoxy group, an ethoxy group, an isopropyloxy group, etc.

In the general formula (16), $R_{25}$ and $R_{26}$ each represent an alkyl group or an alkoxy group having 1 to 4 carbon atoms, and may be different from or the same as each other. Specific examples of $R_{25}$ and $R_{26}$ include a methyl group, an ethyl group, an isopropyl group, a tert-butyl group, a methoxy group, an ethoxy group, an isopropyloxy group, etc.

In the general formula (17), $R_{27}$ and $R_{28}$ each independently represent a hydrogen atom or a methyl group. $n_1$ and $n_2$ each independently represent an integer of 0 to 7.

In the general formula (17), $R_{29}$ represents a divalent hydrocarbon group having 1 to 8 carbon atoms, and the carbon atoms may be interposed by an ester bond or an ether bond. The divalent hydrocarbon group may be linear, branched, or cyclic, and specific examples thereof include alkanediyl groups such as a methylene group, an ethane-1,1-diyl group, an ethane-1,2-diyl group, a propane-1,2-diyl group, a propane-1,3-diyl group, a butane-1,2-diyl group, a butane-1,3-diyl group, and a butane-1,4-diyl group; etc. Furthermore, an ester bond or an ether bond may be interposed between the carbon atoms of the divalent hydrocarbon group. Among these, a methylene group or an ethylene group is preferable as $R_{29}$, and a methylene group is more preferable.

In the general formula (18), $R_{30}$ and $R_{31}$ each independently represent a hydrogen atom or an alkyl group having 1 to 20 carbon atoms and optionally containing a heteroatom. Examples of the alkyl group include those given in the description of $R_{19}$ to $R_{22}$. $R_{30}$ and $R_{31}$ preferably represent a hydrogen atom or a methyl group.

In the general formula (18), $n_3$ represents an integer of 0 to 10, and is preferably 0.

The resin containing a siloxane skeleton of the present invention preferably has a weight-average molecular weight of 3,000 to 500,000 and more preferably 5,000 to 100,000 from the viewpoints of compatibility and photo-curability of a photo-curable resin composition using this resin containing a siloxane skeleton, and the mechanical characteristics of a cured material obtained from the photo-curable resin composition.

The resin (A) can be as described above. In addition, among these resins, when a polymerizable unsaturated bonding group is contained in the structural unit, the resin has a characteristic that it becomes insoluble in a developer since radical polymerization proceeds with the radicals generated in the exposed portion in pattern formation as initiators by combining the resin with the photoradical initiator described below. Therefore, it is possible to provide a negative photosensitive resin composition without newly adding a crosslinking agent. In addition, it is possible to provide a positive photosensitive resin composition by combining with a photosensitizer described below which generates an acid by light to increase a dissolution rate in an alkaline aqueous solution and is a compound having a quinonediazide structure. In addition, a negative photosensitive resin composition can be formed by using an acid generated from a photo-acid generator described below as a catalyst and by a crosslinking group of the component (E) described below being crosslinked with the resin of the component (A).

[(B) Photosensitizer]

A photosensitizer (B) is a substance that has a function of making a resin soluble or insoluble to a solvent on receiving light. It is possible to use the following component (B) for constructing a positive photosensitive resin composition or a negative photosensitive resin composition. Note that one kind of the component (B) or two or more kinds thereof can be used, and when two or more kinds are used, each may have a different function. In addition, the component (B) can be a compound that generates an acid by light (photo-acid generator).

(Positive Photosensitive Resin Composition)

To construct a positive photosensitive resin composition in the present invention, the component (B) is preferably a photosensitizer that generates an acid by light to increase a dissolution rate in an alkaline aqueous solution and is a compound having a quinonediazide structure. Examples of the component (B) include a compound having a 1,2-naphthoquinonediazide sulfonyl group in the molecule.

Examples of the compound having a 1,2-naphthoquinonediazide sulfonyl group in the molecule include a compound having a 1,2-naphthoquinonediazide sulfonyl group shown by the following general formula (19) or (20) in the molecule.

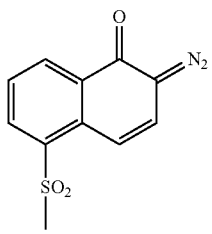
(19)

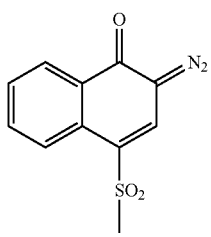
(20)

As the compound into which the 1,2-naphthoquinonediazide sulfonyl group is to be introduced, it is suitable to use specifically trihydroxybenzophenone, tetrahydroxybenzophenone, a ballast molecule having a phenolic hydroxy group shown by the following general formula (21), or a novolac resin having a repeating unit shown by the following formula (26) and a weight-average molecular weight preferably in the range of 2,000 to 20,000, more preferably 3,000 to 10,000. That is, the following resin and compound having a phenolic hydroxy group in each of which a hydrogen atom of the phenolic hydroxy group has been substituted with the 1,2-naphthoquinonediazide sulfonyl group are suitably used as the component (B).

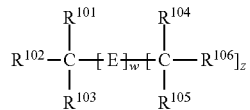
(21)

Here, $R^{101}$ to $R^{106}$ each independently represent a hydrogen atom, a methyl group, a group shown by the following formula (22), or a group shown by the following formula (23). "w" represents an integer of 0 to 2. "z" represents an integer of 0 to 2. When "z" is 0, "w" is 1 or 2. When "z" is 0 and "w" is 1, E represents a hydrogen atom, a methyl group, or a group shown by the following formula (22). When "z" is 0 and "w" is 2, one E is a methylene group or a group shown by the following formula (24), and the other E is a hydrogen atom, a methyl group or a group shown by the following formula (22). When "z" is 1, E is a methylene group or a group shown by the following formula (24). When "z" is 2 and "w" is 1, E is a methine group or a group shown by the following formula (25). When "z" is 2 and "w" is 2, one E is a methylene group or a group shown by the following formula (24), and the other E is a methine group or a group shown by the following formula (25).

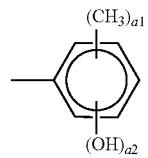
(22)

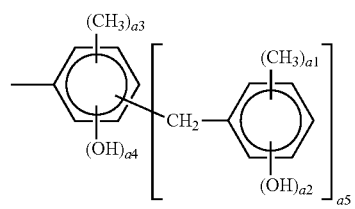
(23)

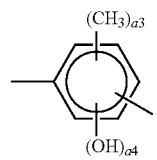
(24)

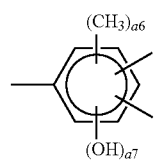
(25)

In the formulae, a1, a2, a3, a4, a5, a6, and a7 each represent an integer of 0 to 3 and satisfy a1+a2≤5, a3+a4≤4, and a6+a7≤3.

In this case, in the low nuclide component (ballast molecule) of the formula (21), the number of the benzene rings is preferably 2 to 20, more preferably 2 to 10, further preferably 3 to 6; meanwhile, a ratio of the number of the phenolic hydroxy groups and the number of the benzene rings is preferably 0.5 to 2.5, more preferably 0.7 to 2.0, further preferably 0.8 to 1.5.
Specific examples of such a low nuclide component (ballast molecule) include the following.
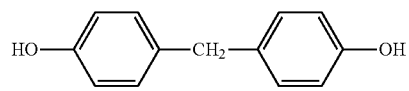
(B-1)
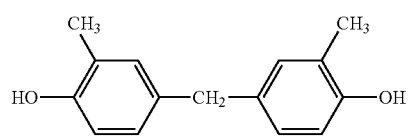
(B-2)
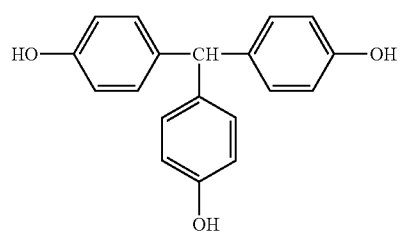
(B-3)
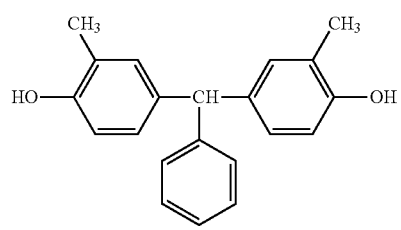
(B-4)
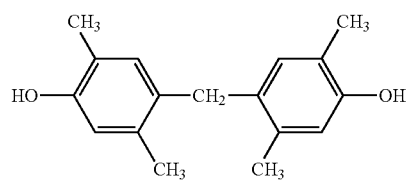
(B-5)
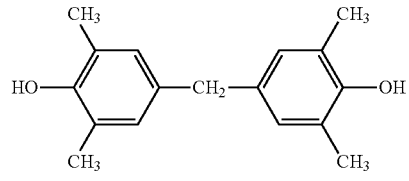
(B-6)
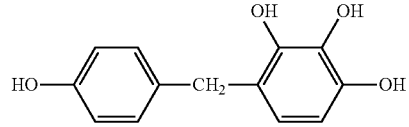
(B-7)
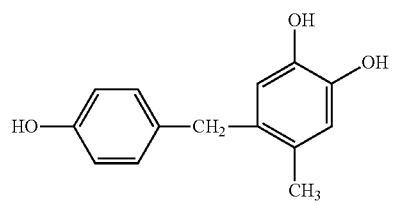
(B-8)
-continued
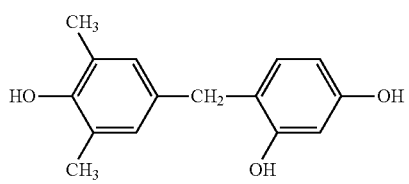
(B-9)
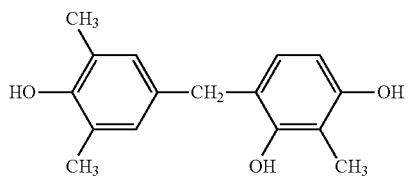
(B-10)
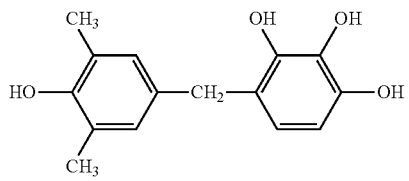
(B-11)
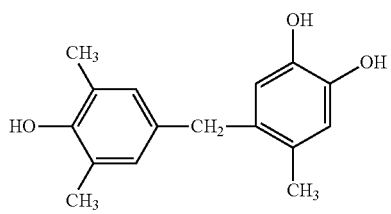
(B-12)
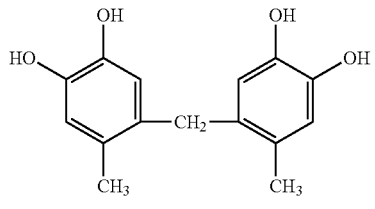
(B-13)
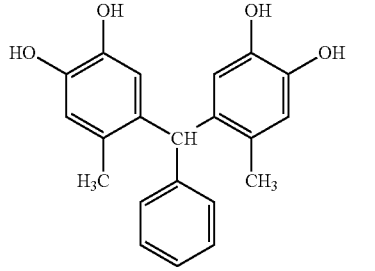
(B-14)
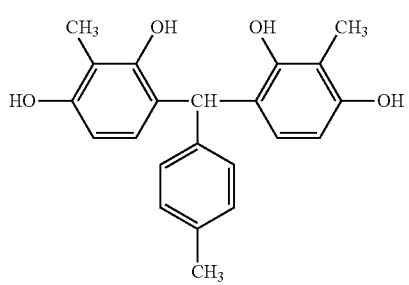
(B-15)

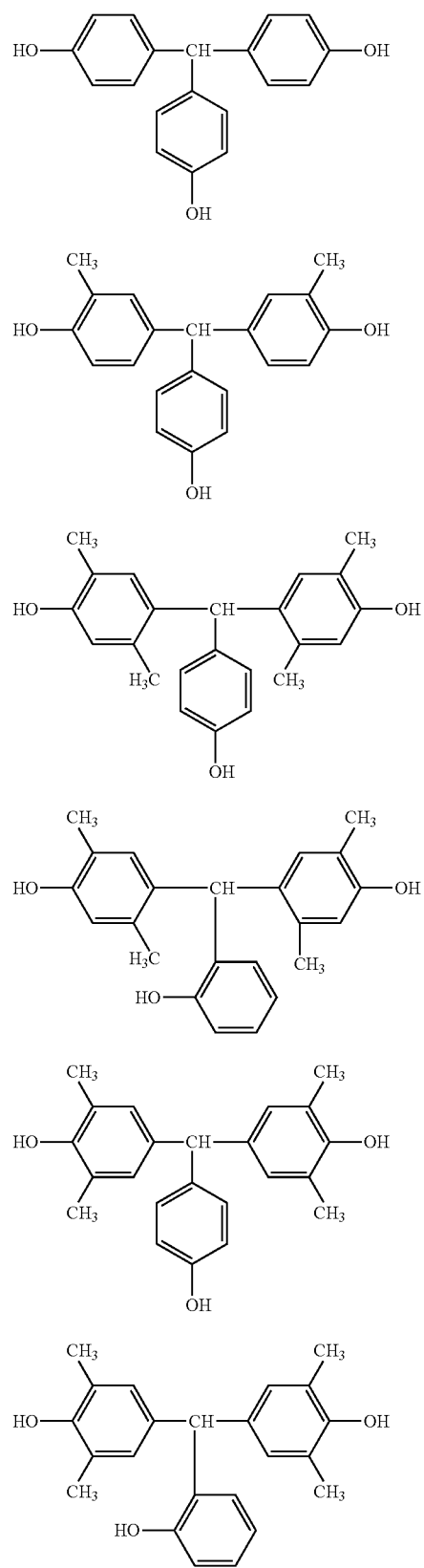
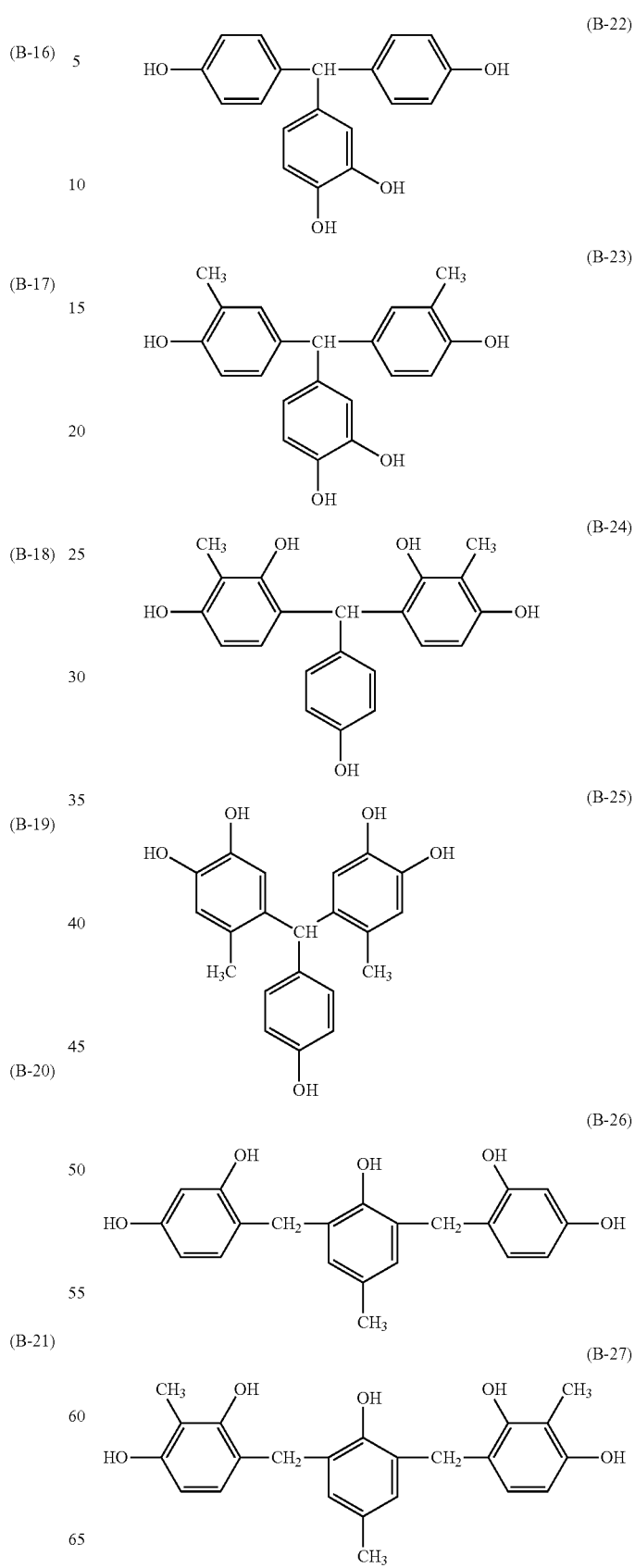

(B-28)
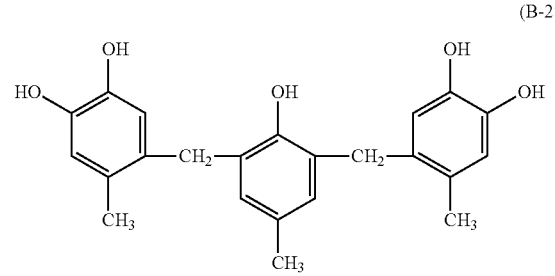
(B-29)
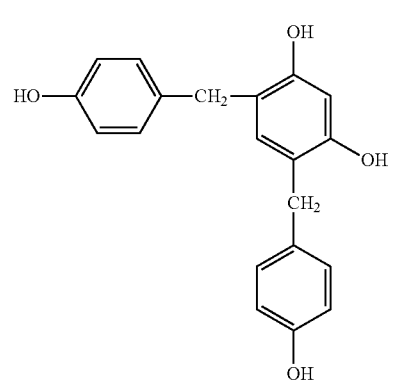
(B-30)
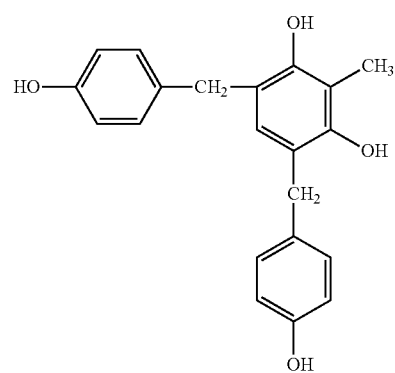
(B-31)
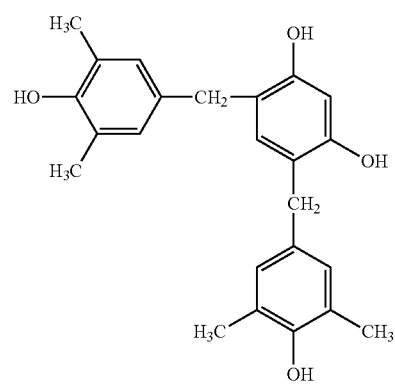
(B-32)
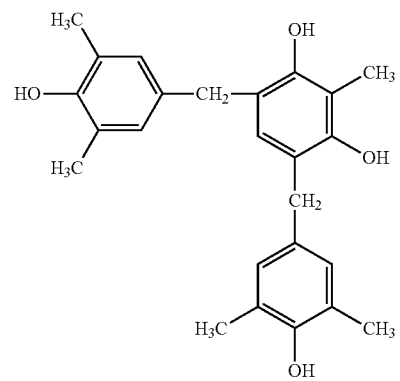
(B-33)
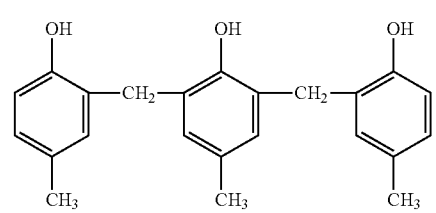
(B-34)
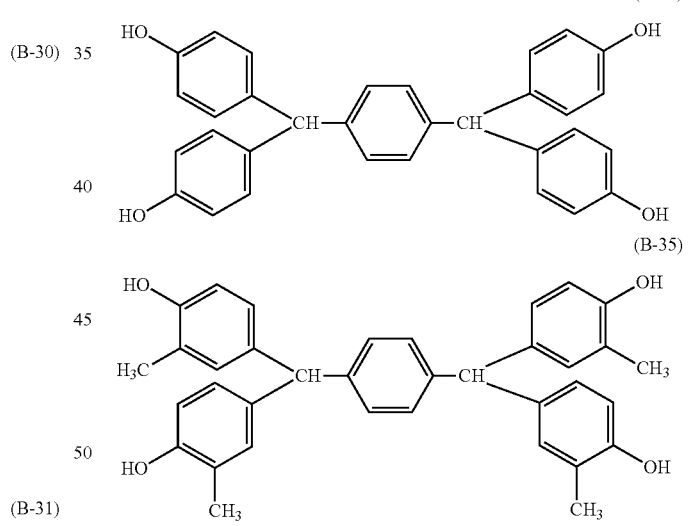
(B-35)
(B-36)
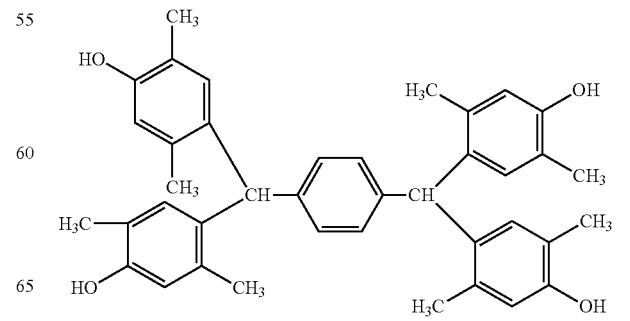

(B-37)
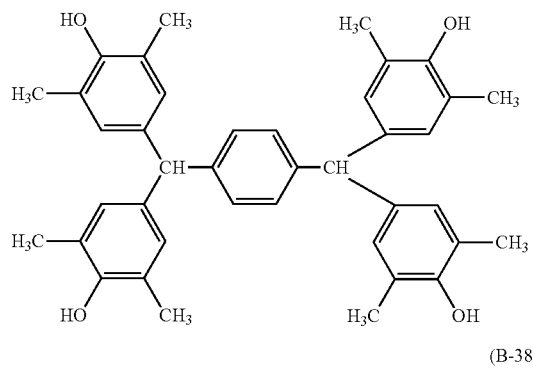

(B-38)
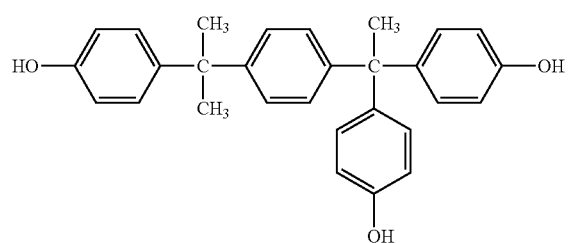

(B-39)
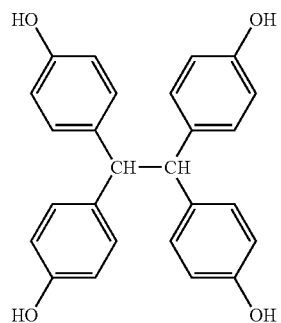

(B-40)
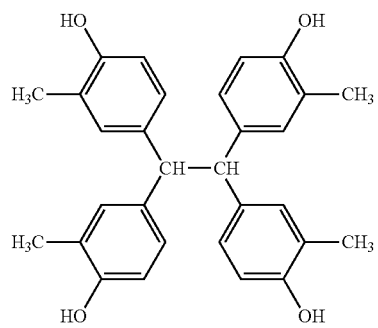

(B-41)
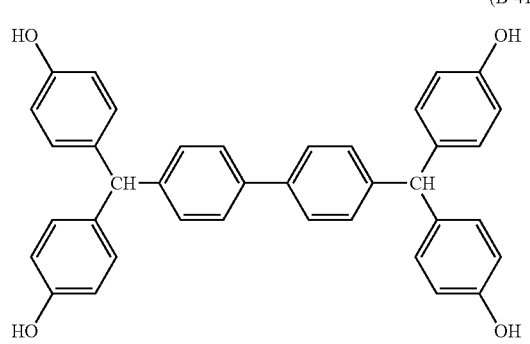

(B-42)
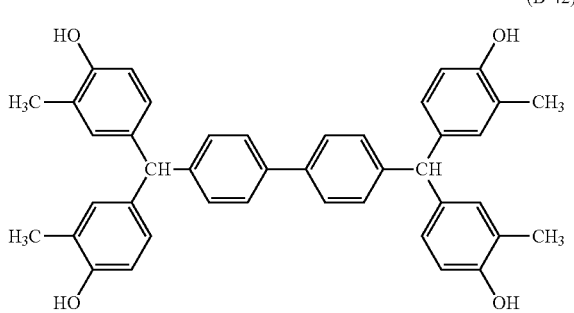

(B-43)
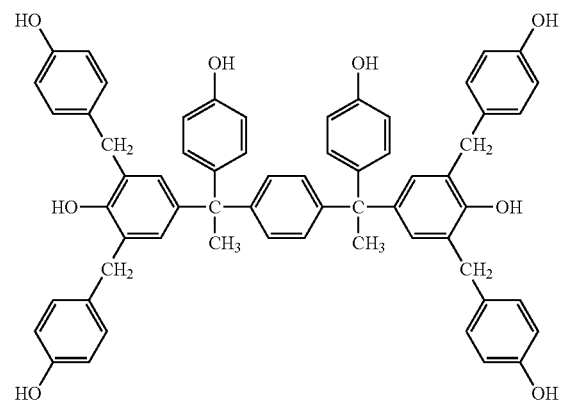

(B-44)
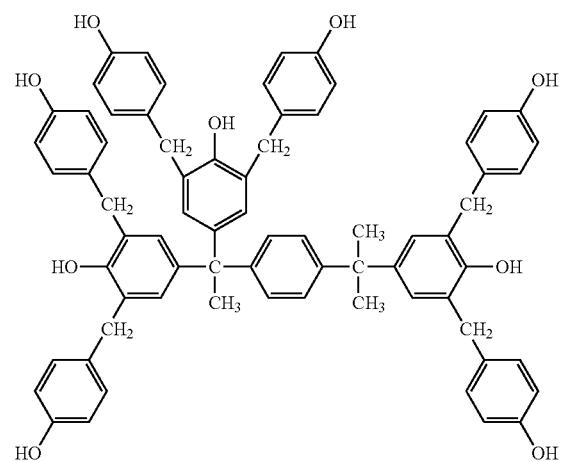

Among the exemplified low nuclide components (ballast molecules), (B-3), (B-29), (B-33), (B-38), and the like are suitably used. Compounds obtained by substituting the hydrogen atom of the phenolic hydroxy group of these ballast molecules by a 1,2-naphthoquinonediazide sulfonyl group are suitably used for the component (B) in the photosensitive resin composition of the present invention.

(26)

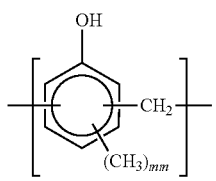

In the formula, "mm" represents an integer of 0 to 3.

The novolac resin having a repeating unit shown by the formula (26) can be synthesized by condensing an aldehyde and a phenol shown by the following formula (27), specifically, at least one phenol such as o-cresol, m-cresol, p-cresol, and 3,5-xylenol, by an ordinary method.

(27)

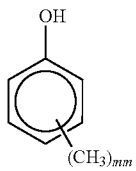

In the formula, "mm" represents an integer of 0 to 3.

In this case, examples of the aldehyde include formaldehyde, paraformaldehyde, acetaldehyde, benzaldehyde, and the like. Formaldehyde is suitable.

A ratio of the phenol shown by the formula (27) and the aldehyde is preferably 0.2 to 2, particularly 0.3 to 2, in terms of molar ratio.

In the method for introducing the 1,2-naphthoquinonediazide sulfonyl group into the compound into which the 1,2-naphthoquinonediazide sulfonyl group is to be introduced, it is preferable to utilize a dehydrochlorination condensation reaction of 1,2-naphthoquinonediazide sulfonyl chloride with a phenolic hydroxy group using a basic catalyst. In the case of the ballast molecule shown by the formula (21), trihydroxybenzophenone, or tetrahydroxybenzophenone, the ratio of substituting the hydrogen atom of the phenolic hydroxy group with the 1,2-naphthoquinonediazide sulfonyl group is 10 to 100 mol %, preferably 50 to 100 mol %. In the case of the novolac resin shown by the formula (26) having a repeating unit, the ratio of substituting the hydrogen atom of the phenolic hydroxy group with the 1,2-naphthoquinonediazide sulfonyl group is 2 to 50 mol %, preferably 3 to 27 mol %.

An amount of the component (B) to be added is preferably 1 to 50 parts by mass, more preferably 10 to 40 parts by mass, based on 100 parts by mass of the component (A). Moreover, one kind of the component (B) may be used or two or more kinds thereof may be used in combination.

By formulating such a component (B), the solubility in the alkaline aqueous solution is suppressed by the dissolution inhibiting property of the component (B) and the system becomes alkali-insoluble before exposure. At the time of the exposure, the photosensitizer of the component (B) generates an acid by light whereby the dissolution rate in the alkaline aqueous solution increases, and the system becomes alkali-soluble.

That is, when an alkaline aqueous solution is used as the developer, the unexposed portion is not dissolved in the developer, while the exposed portion is soluble in the developer, so that it is possible to form a positive pattern.

(Negative Photosensitive Resin Composition)

Meanwhile, to construct a negative photosensitive resin composition in the present invention, the component (B) is preferably a compound that generates an acid by light. A negative photosensitive resin composition can be formed by a crosslinking group of the component (E) described below being crosslinked with the resin of the component (A), with an acid generated from the component (B) as a catalyst.

As the component (B) photo-acid generator, it is possible to use a material which generates an acid by irradiation with light having a wavelength of 190 to 500 nm, the acid serving as a curing catalyst. Examples of the photo-acid generator include onium salts, diazomethane derivatives, glyoxime derivatives, β-ketosulfone derivatives, disulfone derivatives, nitrobenzyl sulfonate derivatives, sulfonic acid ester derivatives, imid-yl-sulfonate derivatives, oxime sulfonate derivatives, iminosulfonate derivatives, triazine derivatives, and the like.

Examples of the onium salts include a compound shown by the following general formula (28).

$$(R_{32})_{j1}M^+K^- \quad (28)$$

In the formula, $R_{32}$ represents a linear, branched, or cyclic alkyl group having 1 to 12 carbon atoms, an aryl group having 6 to 12 carbon atoms, or an aralkyl group having 7 to 12 carbon atoms each of which may have a substituent. $M^+$ represents iodonium or sulfonium. $K^-$ represents a non-nucleophilic counter ion. j1 represents 2 or 3.

As the $R_{32}$, examples of the alkyl group include a methyl group, an ethyl group, a propyl group, a butyl group, a cyclohexyl group, a 2-oxocyclohexyl group, a norbornyl group, an adamantyl group, and the like. Examples of the aryl group include a phenyl group; alkoxyphenyl groups such as an o-, m- or p-methoxyphenyl group, an ethoxyphenyl group, and an m- or p-tert-butoxyphenyl group; alkylphenyl groups such as a 2-, 3- or 4-methylphenyl group, an ethylphenyl group, a 4-tert-butylphenyl group, a 4-butylphenyl group, and a dimethylphenyl group; and the like. Examples of the aralkyl group include groups such as a benzyl group and a phenethyl group.

The non-nucleophilic counter ion of $K^-$ includes halide ions such as a chloride ion and a bromide ion; fluoroalkyl sulfonates ion such as triflate ion, 1,1,1-trifluoromethanesulfonate ion, and nonafluorobutanesulfonate ion; arylsulfonates ion such as tosylate ion, benzenesulfonate ion, 4-fluorobenzenesulfonate ion, and 1,2,3,4,5-pentafluorobenzenesulfonate ion; alkylsulfonates ion such as mesylate ion and butanesulfonate ion; and the like.

Examples of the diazomethane derivatives include a compound shown by the following general formula (29).

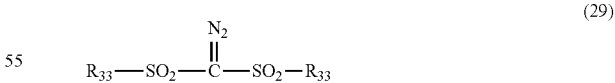

(29)

In the formula, $R_{33}$s may be the same or different from each other, and each represent a linear, branched, or cyclic alkyl group or halogenated alkyl group having 1 to 12 carbon atoms, an aryl group or halogenated aryl group having 6 to 12 carbon atoms, or an aralkyl group having 7 to 12 carbon atoms.

As the $R_{33}$, examples of the alkyl group include a methyl group, an ethyl group, a propyl group, a butyl group, an amyl group, a cyclopentyl group, a cyclohexyl group, a norbornyl group, an adamantyl group, and the like. Examples of the halogenated alkyl group include a trifluoromethyl group, a 1,1,1-trifluoroethyl group, a 1,1,1-trichloroethyl group, a nonafluorobutyl group, and the like. Examples of the aryl group include a phenyl group; alkoxyphenyl groups such as an o-, m- or p-methoxyphenyl group, an ethoxyphenyl group, and an m- or p-tert-butoxyphenyl group; alkylphenyl groups such as a 2-, 3- or 4-methylphenyl group, an ethylphenyl group, a 4-tert-butylphenyl group, a 4-butylphenyl group, and a dimethylphenyl group; and the like. Examples of the halogenated aryl group include a fluorophenyl group, a chlorophenyl group, a 1,2,3,4,5-pentafluorophenyl group, and the like. Examples of the aralkyl group include a benzyl group, a phenethyl group, and the like.

Specific examples of the photo-acid generator include onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, diphenyl(4-thiophenoxyphenyl)sulfonium hexafluoroantimonate, [4-(4-biphenylylthio)phenyl]-4-biphenylylphenylsulfonium tris(trifluoromethane-sulfonyl)methide, triphenylsulfonium tetrakis(fluorophenyl)borate, tris[4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis(pentafluorophenyl)borate; diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfinyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane; glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime; oxime sulfonate derivatives such as α-(benzenesulfoniumoxyimino)-4-methylphenylacetonitrile; β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyldisulfane and dicyclohexyldisulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; imid-yl-sulfonate derivatives such as phthalimide-yl-triflate, phthalimide-yl-tosylate, 5-norbornene-2,3-dicarboximide-yl-triflate, 5-norbornene-2,3-dicarboximide-yl-tosylate, 5-norbornene-2,3-dicarboximide-yl-n-butylsulfinate, and n-trifluoromethylsulfonyloxynaphthylimide; iminosulfonate derivatives such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)-acetonitrile; triazine derivatives such as 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine, 2-(methoxyphenyl)-4,6-bis(trichloromethyl)-s-triazine, 2-[2-(4-methoxyphenyl)ethenyl]-4,6-bis(trichloromethyl)-s-triazine, 2-[2-(3,4-dimethoxyphenyl)ethenyl]-4,6-bis(trichloromethyl)-s-triazine; 2-methyl-2[(4-methylphenyl)sulfonyl]-1-[(4-methylthio)phenyl]-1-propane, and the like. Among these, imid-yl-sulfonate derivatives, iminosulfonate derivatives, oxime sulfonate derivatives, and the like are suitably used. One kind of these photo-acid generators can be used or two or more kinds thereof can be used.

A formulation amount of the photo-acid generator of the component (B) is preferably 0.05 to 20 parts by mass, particularly preferably 0.2 to 5 parts by mass, based on 100 parts by mass of the component (A) in the negative photosensitive resin composition of the present invention from the viewpoint of light absorption of the photo-acid generator itself and photo-curability of the thick film.

In another embodiment of a negative photosensitive resin composition, the component (B) can be a photoradical initiator. By using such a component (B), a resin can be crosslinked and made insoluble. As the photoradical initiator, it is possible to select any compound conventionally used as a photopolymerization initiator for UV-curing. Preferable examples of the photoradical initiator include benzophenone derivatives such as benzophenone, methyl o-benzoyl benzoate, 4-benzoyl-4'-methyl diphenyl ketone, dibenzyl ketone, and fluorenone; acetophenone derivatives such as 2,2'-diethoxyacetophenone, 2-hydroxy-2-methylpropiophenone, and 1-hydroxycyclohexyl phenyl ketone; thioxanthone derivatives such as thioxanthone, 2-methylthioxanthone, 2-isopropylthioxanthone, and diethylthioxanthone; benzyl derivatives such as benzyl, benzyl dimethyl ketal, and benzyl-β-methoxyethyl acetal; benzoin derivatives such as benzoin and benzoin methyl ether; oximes such as 1-phenyl-1,2-butanedione-2-(O-methoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime; and 1-phenyl-3-ethoxypropanetrione-2-(O-benzoyl)oxime; N-arylglycines such as N-phenylglycine; peroxides such as benzoyl perchloride; and aromatic biimidazoles; and the like, and the invention is not limited by these. Furthermore, one of these may be used or a mixture of two or more thereof may be used. Among the above-described photoradical initiators, an oxime is more preferable, in particular, in view of photosensitivity.

One of the photo-acid generator and the photoradical initiator may each be used, or the photo-acid generator and the photoradical initiator may be used in combination as necessary.

The formulation amount of the component (B) is preferably 0.1 part by mass to 20 parts by mass based on 100 parts by mass of the component (A) resin, more preferably 2 parts by mass to 15 parts by mass in view of photosensitivity characteristics. When 0.1 part by mass or more of the component (B) is blended relative to 100 parts by mass of the component (A), the obtained negative photosensitive resin composition becomes excellent in photosensitivity. Meanwhile, when 20 parts by mass or less is blended, the obtained negative photosensitive resin composition becomes excellent in curing property of the thick film.

[(C) Surfactant]

The inventive photosensitive resin composition contains a surfactant containing a structural unit represented by the following average composition formula (1). When a structural unit represented by the following average composition formula (1) is contained, film thickness uniformity on application becomes excellent, and coating defects when forming a thick film can be reduced in both a positive photosensitive resin composition and a negative photosensitive resin composition.

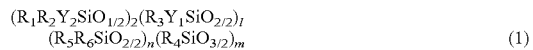

(1)

In the formula, $Y_1$ and $Y_2$ each independently represent a hydrogen atom, a methyl group, a phenyl group, or a group represented by the following general formula (2). At least one of $Y_1$ and $Y_2$ is a group represented by the following general formula (2). $R_1$ to $R_6$ are monovalent hydrocarbon groups that may be the same or different and optionally contain a heteroatom, having 1 to 20 carbon atoms. "l" and "n" are each independently integers of 1 to 100, and "m" is an integer of 0 to 100.

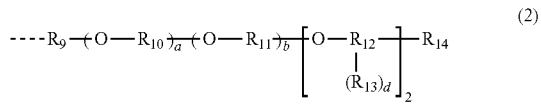

(2)

In the formula, a dotted line represents a bond. $R_9$, $R_{10}$, and $R_{11}$ each independently represent a linear or branched alkylene group having 2 to 10 carbon atoms where $R_{10}$ is different from $R_{11}$. $R_{12}$ represents a trivalent hydrocarbon group having 2 to 10 carbon atoms. $R_{13}$ represents a structure having one or more repeating units selected from $(OR_{10})$, $(OR_{11})$, and $(OR_{12})$. $R_{14}$ represents a hydroxy group, a linear or branched alkyl group having 1 to 10 carbon atoms, a linear or branched alkyl ether group having 1 to 10 carbon atoms, a linear or branched unsaturated alkyl ether group having 1 to 10 carbon atoms, or a linear or branched alkyl ester group having 1 to 10 carbon atoms. "a" represents an integer of 1 to 50, "b" represents an integer of 0 to 50, "c" represents an integer of 0 to 50, and "d" represents an integer of 1 to 20. —$OR_{10}$—, —$OR_{11}$—, and —$OR_{12}$ ($R_{13}$)— may be in a random order.

In the average composition formula (1), $R_1$ to $R_6$ may be the same as or different from each other, and each represent a monovalent hydrocarbon group having 1 to 20 carbon atoms and optionally containing a heteroatom. Specific examples of $R_1$ to $R_6$ include the same ones as those given as specific examples of $R_{19}$ to $R_{22}$ in the general formula (14).

In the general formula (2), $R_9$, $R_{10}$, and $R_{11}$ each independently represent a linear or branched alkylene group having 2 to 10 carbon atoms where $R_{10}$ is different from $R_{11}$. $R_{12}$ represents a trivalent hydrocarbon group having 2 to 10 carbon atoms. $R_{13}$ represents a structure having one or more repeating units selected from $(OR_{10})$, $(OR_{11})$, and $(OR_{12})$. $R_{14}$ represents a hydroxy group, a linear or branched alkyl group having 1 to 10 carbon atoms, a linear or branched alkyl ether group having 1 to 10 carbon atoms, a linear or branched unsaturated alkyl ether group having 1 to 10 carbon atoms, or a linear or branched alkyl ester group having 1 to 10 carbon atoms. $R_9$, $R_{10}$, and $R_{11}$ each preferably represent a linear or branched alkylene group having 2 to 4 carbon atoms, and $R_{12}$ preferably represents a trivalent hydrocarbon group having 2 to 4 carbon atoms.

In the average composition formula (1), "l" and "n" each independently represent an integer of 1 to 100 and "m" represents an integer of 0 to 100. "l" is preferably an integer of 1 to 50, more preferably an integer of 1 to 30. "n" is preferably an integer of 10 to 50, more preferably an integer of 10 to 30. "m" is preferably an integer of 0 to 50, more preferably an integer of 0 to 30. When "m" is not 0, "m" is preferably an integer of 1 to 5. When "l", "m", and "n" are in the above ranges, film thickness uniformity at the time of application can be improved, and antifoaming properties at the time of thick film formation can be improved.

In the general formula (2), "a" represents an integer of 1 to 50, "b" represents an integer of 0 to 50, "c" represents an integer of 0 to 50, and "d" represents an integer of 1 to 20. "a" is preferably an integer of 10 to 30, "b" is preferably an integer of 10 to 30, and "c" is preferably an integer of 0 to 20. When "a", "b", and "c" are within the above ranges, the composition can be given sufficient solubility to a solvent, and has appropriate balance with a siloxane structure. Thus, film thickness uniformity on application can be improved, and antifoaming properties on thick film formation can be improved. If "a", "b", and "c" are greater than the upper limits of the above ranges, the proportion of siloxane structures contained becomes small, so that antifoaming properties and function as a surfactant become degraded. On the other hand, if "a", "b", and "c" are smaller than the lower limits of the above ranges, the proportion of polyoxyalkylene groups contained becomes small, so that solubility to a solvent is sometimes degraded.

Specific examples of the surfactant containing a structural unit represented by the average composition formula (1) include compounds shown by the following formulae (C-1) to (C-15), but are not limited thereto.

(C-1) 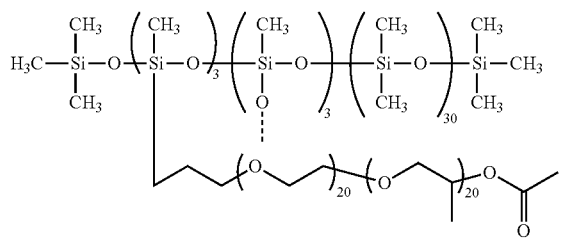
(C-2) 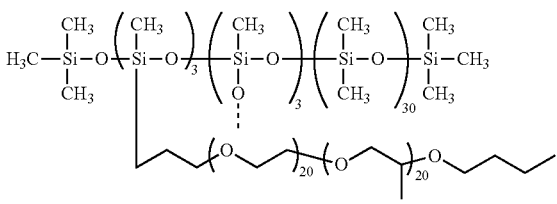
(C-3) 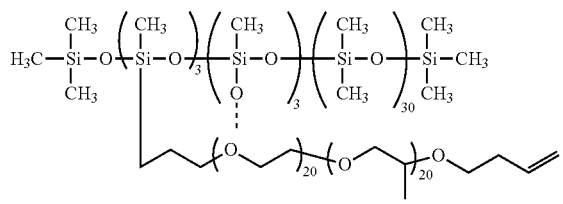
(C-4) 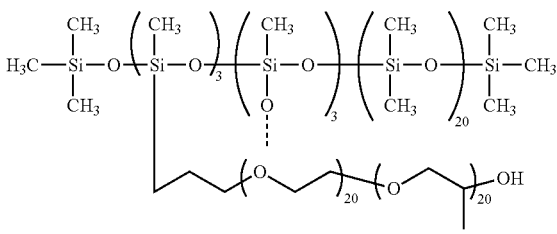
(C-5) 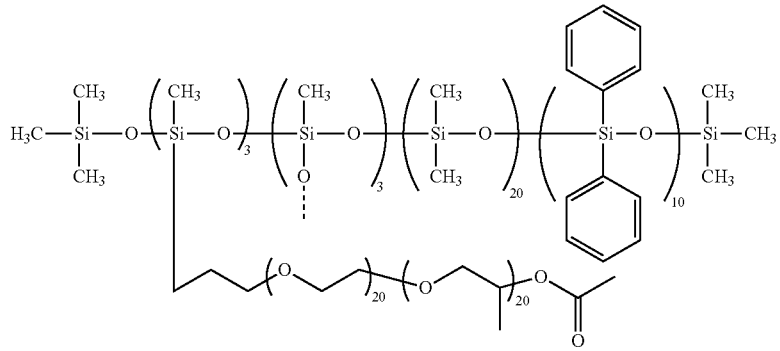
(C-6) 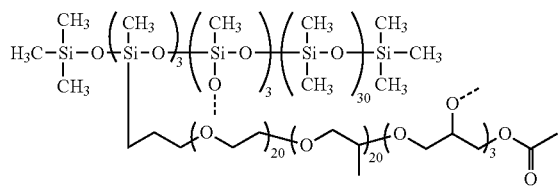
(C-7) 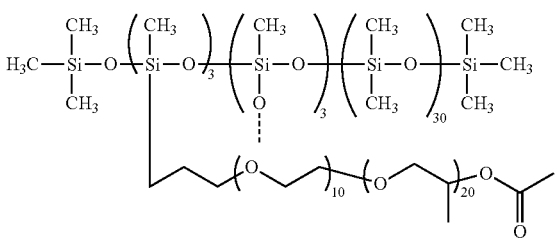
(C-8) 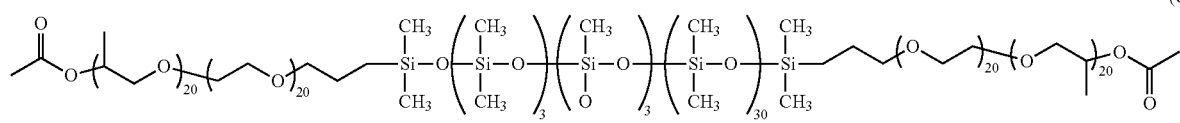
(C-9) 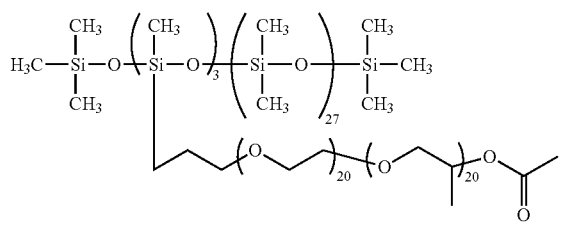
(C-10) 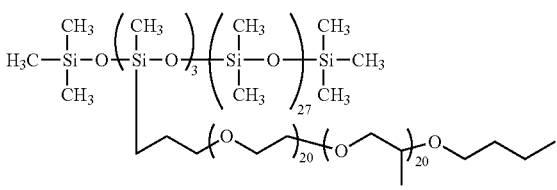

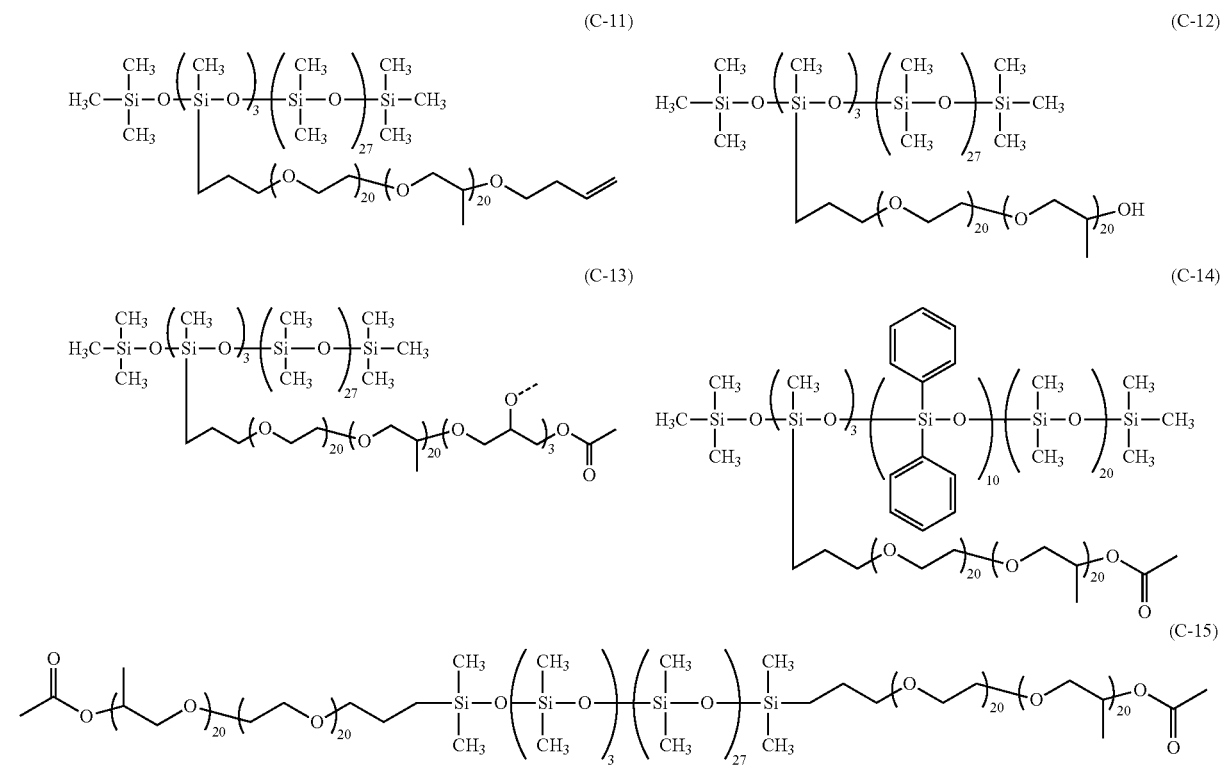

Out of the dotted lines in the formulae, a dotted line in a siloxane chain represents a bond to $(R_1R_2Y_2SiO_{1/2})$, $(R_3Y_1SiO_{2/2})$, $(R_5R_6SiO_{2/2})$, or $(R_4SiO_{3/2})$, and a dotted line in a polyoxyalkylene chain represents a bond to $R_{10}$, $R_{11}$, or $R_{12}$.

The component (C) surfactant has a hydrophobic siloxane chain and a hydrophilic polyoxyalkylene moiety on a side chain thereof. The combination of each units that constitute a siloxane chain and the proportion of each unit, the structure and position (terminal or side chain) of a hydrophilic group shown by the general formula (2), and a substituent in the average composition formula (1) and the general formula (2) can be appropriately adjusted. In this manner, it is possible to achieve sufficient solubility to a solvent and appropriate balance with a siloxane structure, improve film thickness uniformity on application, and improve antifoaming properties on formation of a thick film. Thus it is possible to achieve a photosensitive resin composition having excellent film thickness uniformity on application and reduced coating defects on formation of a thick film.

[(E) Crosslinking Agent]

As necessary, the inventive photosensitive resin composition may contain (E) one or more crosslinking agents selected from an amino condensate modified by formaldehyde or formaldehyde-alcohol; a phenol compound having two or more methylol groups or alkoxymethylol groups by average in one molecule; a compound in which a hydrogen atom of a hydroxy group of a polyvalent phenol is substituted with a glycidyl group; a compound in which a hydrogen atom of a hydroxy group of a polyvalent phenol is substituted with a substituent represented by the following formula (E-1); and a compound containing two or more nitrogen atoms having a glycidyl group represented by the following formula (E-2).

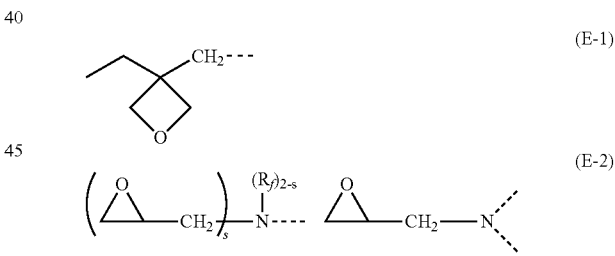

In the formulae, a dotted line represents a bond, $R_f$ represents a linear, branched or cyclic alkyl group having 1 to 6 carbon atoms, and "s" represents 1 or 2.

Examples of the amino condensate modified by the formaldehyde or formaldehyde-alcohol include melamine or melamine condensates modified by formaldehyde or formaldehyde-alcohol, and urea condensates modified by formaldehyde or formaldehyde-alcohol.

In the preparation of the melamine condensate modified by formaldehyde or formaldehyde-alcohol, for example, first, a melamine monomer is modified by formalin to methylolation according to a known method, or the resultant is optionally further modified by an alcohol to alkoxylation, so that a modified melamine shown by the following general formula (30) is formed. The alcohol is preferably a lower alcohol, for example, an alcohol having 1 to 4 carbon atoms.

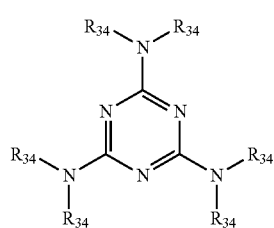

(30)

In the formula, $R_{34}$s may be the same or different from each other, and each represent a methylol group, an alkoxymethyl group containing an alkoxy group having 1 to 4 carbon atoms, or a hydrogen atom. At least one $R_{34}$ is a methylol group or the alkoxymethyl group.

Examples of the $R_{34}$ include alkoxymethyl groups such as a methylol group, a methoxymethyl group, and an ethoxymethyl group; a hydrogen atom; and the like.

Specific examples of the modified melamine shown by the general formula (30) include trimethoxymethylmonomethylol melamine, dimethoxymethylmonomethylol melamine, trimethylol melamine, hexamethylol melamine, hexamethoxymethylol melamine, and the like. Then, the modified melamine shown by the general formula (30) or its multimer (for example, an oligomer such as a dimer or a trimer) is subjected to addition condensation polymerization with formaldehyde until the product has a desired molecular weight according to a conventional method. Thus, a melamine condensate modified by formaldehyde or formaldehyde-alcohol is obtained.

Meanwhile, in the preparation of the urea condensate modified by formaldehyde or formaldehyde-alcohol, for example, a urea condensate having a desired molecular weight is modified by formaldehyde to methylolation according to a known method, and the resultant is optionally further modified by an alcohol to alkoxylation.

Specific examples of the urea condensate modified by formaldehyde or formaldehyde-alcohol include methoxymethylated urea condensates, ethoxymethylated urea condensates, propoxymethylated urea condensates, and the like.

Note that one of these modified melamine condensates and modified urea condensates can be used or two or more thereof can be used in mixture. In addition, the modified melamine can also be used as the component (E).

Next, examples of the phenol compound having two or more methylol groups or alkoxymethylol groups (alkoxymethyl groups) in one molecule on average include (2-hydroxy-5-methyl)-1,3-benzenedimethanol, 2,2',6,6'-tetramethoxymethylbisphenol A, compounds shown by the following formulae (E-3) to (E-7), and the like.

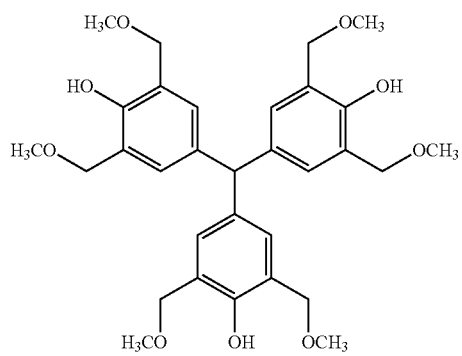

(E-3)

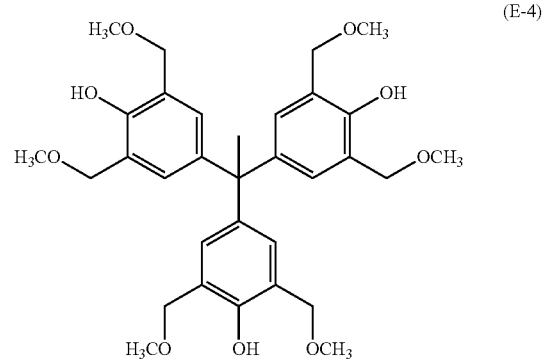

(E-4)

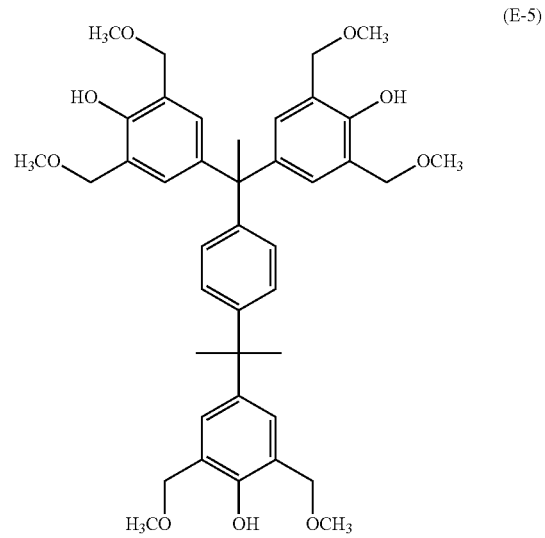

(E-5)

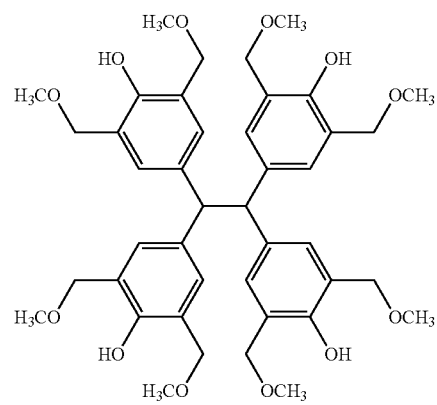

(E-6)

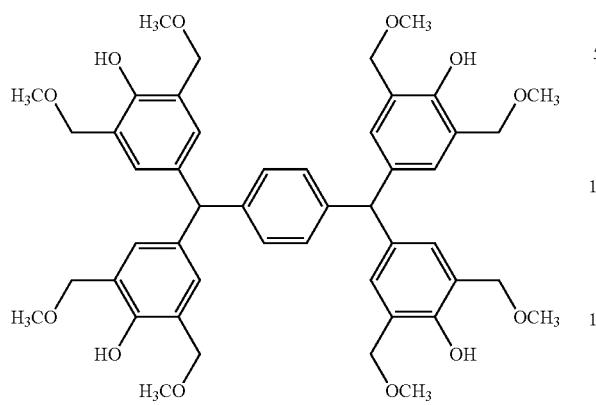

(E-7)

One of the above-described crosslinking agents can be used or two or more thereof can be used in combination.

Meanwhile, examples of the compound in which a hydrogen atom of a hydroxy group of a polyvalent phenol is substituted by a glycidyl group include bisphenol A, tris(4-hydroxyphenyl)methane, and a compound obtained by reacting a hydroxy group of 1,1,1-tris(4-hydroxyphenyl)ethane with epichlorohydrin in the presence of a base. Suitable examples of the compound in which a hydrogen atom of a hydroxy group of a polyvalent phenol is substituted by a glycidyl group include compounds shown by the following formulae (E-8) to (E-14).

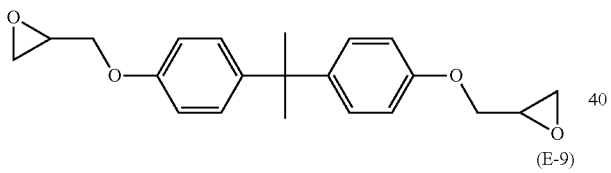

(E-8)

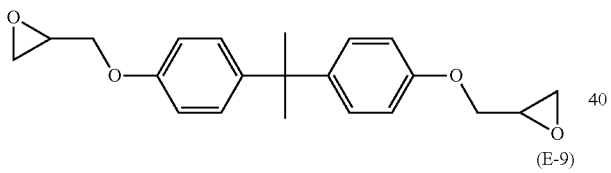

(E-9)

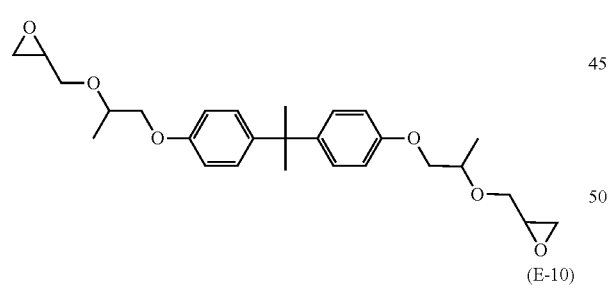

(E-10)

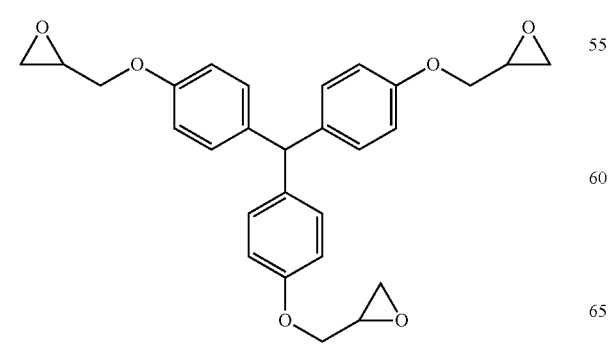

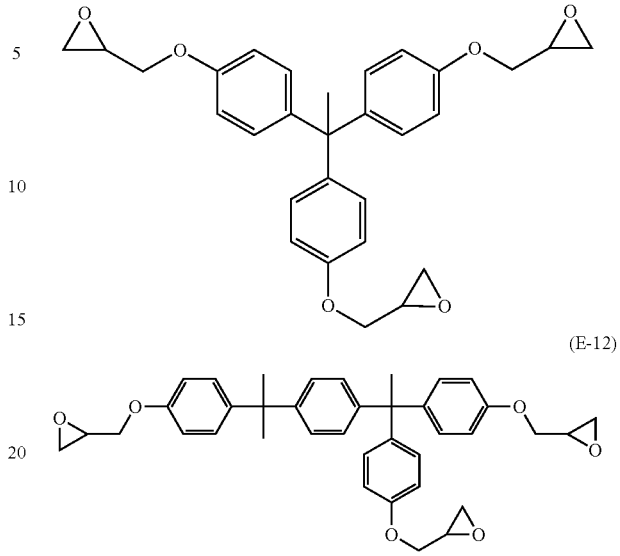

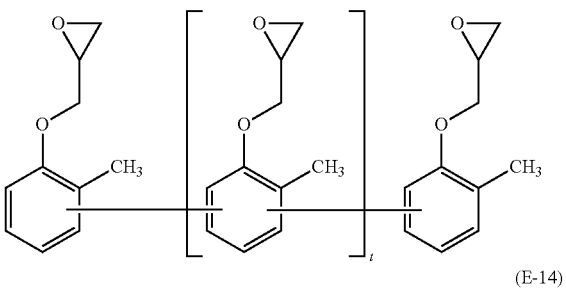

In the formula, "t" satisfies $2 \leq t \leq 3$.

One or more kinds of these compounds in each of which a hydroxy group of a polyvalent phenol is substituted by a glycidoxy group (compounds in each of which a hydrogen atom of a hydroxy group of a polyvalent phenol is substituted by a glycidyl group) can be used as the crosslinking agent.

Examples of the compound in which a hydrogen atom of a hydroxy group of a polyvalent phenol is substituted by a substituent shown by the following formula (E-1) include a compound shown by the following formula (E-15) containing two or more of the substituent.

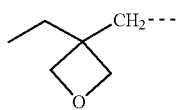
(E-1)

In the formula, the dotted line represents a bond.

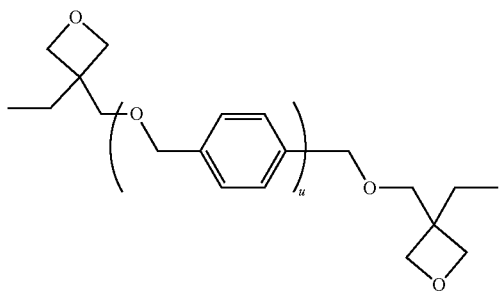
(E-15)

In the formula, "u" satisfies 1≤u≤3.

Meanwhile, examples of the compound containing two or more nitrogen atoms having glycidyl groups shown by the following formula (E-2) include a compound shown by the following formula (E-16).

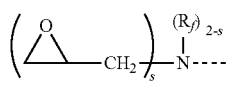
(E-1)

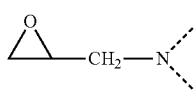
(E-2)

In the formula, a dotted line represents a bond. $R_f$ represents a linear, branched, or cyclic alkyl group having 1 to 6 carbon atoms. "s" represents 1 or 2.

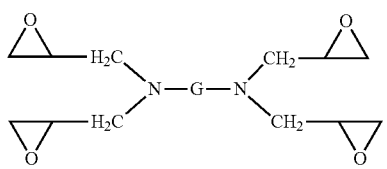
(E-16)

In the formula, G represents a linear, branched, or cyclic alkylene group having 2 to 12 carbon atoms, or a divalent aromatic group.

Examples of the compound shown by the formula (E-16) include compounds shown by the following formulae (E-17) to (E-20).

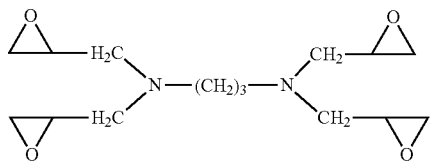
(E-17)

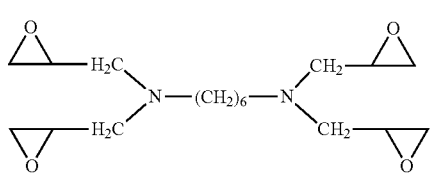
(E-18)

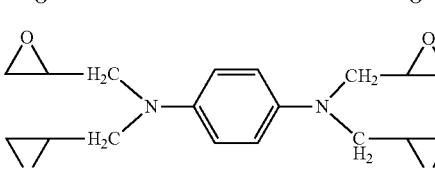
(E-19)

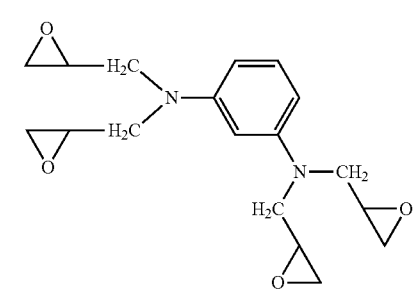
(E-20)

On the other hand, as the compound containing two or more nitrogen atoms having glycidyl groups shown by the formula (E-2), a compound shown by the following formula (E-21) can be suitably used.

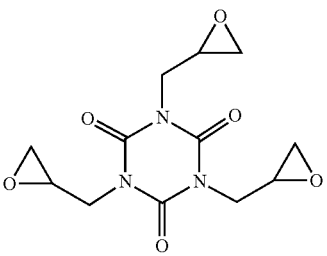
(E-21)

One or more kinds of these compounds containing two or more nitrogen atoms having glycidyl groups shown by the formula (E-2) can be used as the crosslinking agent.

In the positive photosensitive resin composition of the present invention, the component (E) is a component which causes a crosslinking reaction upon post-curing after pattern formation, and further increases the strength of the cured material. Meanwhile, in the negative photosensitive resin composition, the component (E) is, as described above, a component which can form a negative pattern as a result of crosslinking between a crosslinking group of the component (E) and the resin of the component (A) with a catalyst of an acid generated from the component (B). Besides, the component (E) further increases the strength of the cured material by causing a crosslinking reaction in the post-curing after the pattern formation. Such a component (E) preferably has a weight-average molecular weight of 150 to 10,000, particularly preferably 200 to 3,000, from the viewpoints of photo-curability and heat resistance.

A formulation amount of the component (E) is preferably 0.5 to 50 parts by mass, particularly preferably 1 to 30 parts by mass, based on 100 parts by mass of the component (A) in the inventive photosensitive resin composition.

[(D) Solvent]

The inventive photosensitive resin composition contains a solvent (D). The solvent of the component (D) is contained in both the positive photosensitive resin composition and the negative photosensitive resin composition, and is not particularly limited as long as it can dissolve the component (A), the component (B), the component (C), and when contained, the component (E). Examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol-mono-tert-butyl ether acetate, and γ-butyrolactone; amide-based solvents such as N-methyl-2-pyrolidone, N,N-dimethylacetamide, and N,N-dimethylformamide; and the like. One or more of these can be used. Particularly, ethyl lactate, cyclohexanone, cyclopentanone, propylene glycol monomethyl ether acetate, γ-butyrolactone, N-methyl-2-pyrolidone, or a mixed solvent thereof is preferable.

The formulation amount of the component (D) is preferably 50 to 2,000 parts by mass, particularly preferably 100 to 1,000 parts by mass based on 100 parts by mass of the total formulation amount of the component (A), the component (B), the component (C), and when contained, the component (E).

[Other Components]

In addition, the inventive photosensitive resin composition may further contain components other than the essential components: the component (A), the component (B), the component (C), and the component (D). Examples of the other components include (F) a compound that generates an acid by heat, (G) an antioxidant, (H) a silane compound, (I) a basic compound, (J) a protective amine compound, (K) a dissolution inhibitor, (L) a radical polymerizable compound, and the like, besides the above-described component (E).

((F) Compound that Generates Acid by Heat)

The compound that generates an acid by heat of the component (F) can be added for the purpose of thermally promoting the crosslinking reaction between the component (A) and the component (E) in the step of heating and post-curing at a temperature of 100 to 300° C. performed after pattern formation.

In particular, a compound that does not promote curing of a film until a pattern has been formed by development and does not inhibit pattern formation is preferable as the component (F). To achieve this, the component (F) preferably does not generate an acid at the temperature of the step of removing and drying the solvent after applying a film of the photosensitive resin composition, and only generates an acid by the heat treatment after the pattern formation to promote curing of the pattern or film of the positive photosensitive resin composition. Specifically, a compound that decomposes by a heat treatment at 100° C. to 300° C., preferably 150° C. to 300° C. and generates an acid is preferable. When such a component (F) is contained, crosslinking and curing reactions of the pattern or the film of the positive photosensitive resin composition can be further promoted in the step of heating and post-curing at a temperature of 100 to 300° C. after patterning. The component (F) makes it possible to further improve the mechanical strength, the chemical resistance, the adhesiveness or the like of the obtained pattern or film by further forwarding the crosslinking and the curing reactions.

As the compound that generates an acid by a suitable heat, compounds described in paragraphs [0061] to [0085] of JP 2007-199653 A may be exemplified.

A formulation amount of the compound that generates an acid by heat is preferably 0.1 part by mass or more, more preferably 0.5 parts by mass or more, and preferably 30 parts by mass or less, more preferably 10 parts by mass or less based on 100 parts by mass of the component (A) in the inventive photosensitive resin composition.

((G) Antioxidant)

Degradation of an aliphatic group or a phenolic hydroxy group of the component (A) by oxidation can be suppressed by the component (G) antioxidant being contained. In addition, by an anticorrosive effect to metal materials, it is possible to suppress oxidation of metal by water from outside, a photo-acid generator, or a thermal acid generator, etc. and accompanying adhesion degradation and delamination.

Specific examples of antioxidants that can be used here include hindered phenol-based antioxidants, phosphorus-based antioxidants, quinone-based antioxidants and sulfur-based antioxidants as preferable examples. However, the antioxidant is not limited thereto. Moreover, one of these antioxidants can be used or two or more thereof can be used in combination.

Furthermore, out of the above-described specific examples of antioxidants, examples of the hindered phenol-based antioxidants include pentaerythritol tetrakis[3-(3,5-di-tert-butyl-4-hydroxyphenyl)propionate] (Irganox 1010 (trade name), manufactured by BASF Japan Ltd.), thiodiethylenebis[3-(3,5-di-tert-butyl-4-hydroxyphenyl)propionate] (Irganox 1035 (trade name), manufactured by BASF Japan Ltd.), octadecyl[3-(3,5-di-tert-butyl-4-hydroxyphenyl)propionate] (Irganox 1076 (trade name), manufactured by BASF Japan Ltd.), octyl-1-3,5-di-tert-butyl-4-hydroxyhydrocinnamic acid (Irganox 1135 (trade name), manufactured by BASF Japan Ltd.), 4,6-bis(octylthiomethyl-o-cresol) (Irganox 1520L, manufactured by BASF Japan Ltd.), Sumilizer GA80 (trade name, manufactured by Sumitomo Chemical Co., Ltd.), Adekastab AO-20 (trade name, manufactured by ADEKA CORPORATION), Adekastab AO-30 (trade name, manufactured by ADEKA CORPORATION), Adekastab AO-40 (trade name, manufactured by ADEKA CORPORATION), Adekastab AO-50 (trade name, manufactured by ADEKA CORPORATION), Adekastab AO-60 (trade name, manufactured by ADEKA CORPORATION), Adekastab AO-80 (trade name, manufactured by ADEKA CORPORATION), Adekastab AO-330 (trade name, manufactured by ADEKA CORPORATION), hindered phenol-based antioxidants disclosed in WO 2017/188153 A1, and the like.

Furthermore, out of the above-described specific examples of antioxidants, examples of the phosphorus-based antioxidants include triphenyl phosphite, tris(methylphenyl) phosphite, triisooctyl phosphite, tridecyl phosphite, tris(2-ethylhexyl) phosphite, tris(nonylphenyl) phosphite, tris(octylphenyl) phosphite, tris[decylpoly(oxyethylene)] phosphite, tris(cyclohexylphenyl) phosphite, tricyclohexyl phosphite, tri(decyl)thio phosphite, triisodecylthio phosphite, phenyl-bis(2-ethylhexyl) phosphite, phenyl-diisodecyl phosphite, tetradecylpoly(oxyethylene)-bis(ethylphenyl) phosphite, phenyl-dicyclohexyl phosphite, phenyl-diisooctyl phosphite, phenyl-di(tridecyl) phosphite, diphenyl-cyclohexyl phosphite, diphenyl-isooctyl phosphite, diphenyl-2-ethylhexyl phosphite, diphenyl-isodecyl phosphite, diphenyl-cyclohexylphenyl phosphite, diphenyl-(tridecyl)thio phosphite, and the like.

Furthermore, out of the above-described specific examples of antioxidants, examples of the sulfur-based antioxidants include Adekastab AO-412S (trade name, manufactured by ADEKA CORPORATION), AO-503S (trade name, manufactured by ADEKA CORPORATION), Sumilizer TP-D (trade name, manufactured by Sumitomo Chemical Co., Ltd.), and the like.

Sulfur-based antioxidants and phosphorus-based antioxidants can be expected to have an effect of decomposing peroxides.

The contained amount of the antioxidant (G) is preferably 0.1 to 10 parts by mass, more preferably 0.2 to 5 parts by mass based on 100 parts by mass of the component (A) resin. When the contained amount is 0.1 part by mass or more, adhesiveness to metal materials is enhanced, while at the same time, delamination is suppressed. Meanwhile, when the contained amount is 10 parts by mass or less, the developing properties of the composition and the toughness of the cured film are not degraded.

((H) Silane Compound)

When the component (H) silane compound is contained, not only is the adhesiveness to metal materials enhanced, it is also possible to suppress the delamination of the cured film in reliability tests such as a thermal shock test and a high temperature and high humidity test.

A silane compound that can be used here can be any silane compound as long as the silane compound has an alkoxysilyl group. Suitable, specific examples include the following: γ-glycidoxypropyltriethoxysilane, γ-glycidoxypropyltrimethoxysilane, 2-(3,4-epoxycyclohexyl)ethyltrimethoxysilane, bis(2-hydroxyethyl)-3-aminopropyl-triethoxysilane, γ-aminopropyltrimethoxysilane, γ-aminopropyltriethoxysilane, vinyltriethoxysilane, vinyltrimethoxysilane, γ-methacryloxypropyltrimethoxysilane, γ-acryloxypropyltrimethoxysilane, 3-mercaptopropyltrimethoxysilane, 3-isocyanatepropyltriethoxysilane, bis(2-hydroxyethyl)-3-aminopropyltriethoxysilane, triethoxysilylpropylethyl carbamate, 3-(triethoxysilyl)propyl succinic anhydride, phenyltriethoxysilane, phenyltrimethoxysilane, N-phenyl-3-aminopropyltrimethoxysilane, 3-triethoxysilyl-N-(1,3-dimethylbutylidene)propylamine, amide group-containing silane compounds disclosed in JP 6414060 B, thiourea group-containing silane compounds disclosed in WO 2016/140024 A and JP 5987984 B, thiol group-containing silane compounds disclosed in JP 2017-044964 A, and the like. However, the silane compound is not limited thereto. Furthermore, one of these silane compounds can be used or a combination of two or more thereof can be used.

The contained amount of the silane compound (H) is preferably 0.1 to 20 parts by mass, more preferably 1 to 10 parts by mass, and further preferably 3 to 6 parts by mass based on 100 parts by mass of the component (A) resin. With 0.1 part by mass or more, more sufficient adhesiveness with a substrate can be provided, and when 20 parts by mass or less, it is possible to further suppress the problem of increasing viscosity or the like when storing at room temperature. Meanwhile, when the contained amount is 10 parts by mass or less, the developing properties of the composition are not degraded, so that development residue is not caused.

((I) Basic Compound)

When the component (I) basic compound is contained, it is possible to suppress the diffusion rate when an acid generated by the photo-acid generator diffuses in a resist film. In the case of a negative photosensitive resin composition, blending the basic compound improves the resolution, suppresses a change in sensitivity after exposure, reduces the substrate dependency and environment dependency, and can improve the exposure margin, pattern shape, and so forth.

Examples of the basic compound include primary, secondary, and tertiary aliphatic amines, hybrid amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives, imide derivatives, a compound shown by the following general formula (31), and the like.

$$N(\alpha)_q(\beta)_{3-q} \qquad (31)$$

In the formula, "q" is 1, 2, or 3. The side chain α may be the same as or different from each other, and is one of the substituents shown by the following general formulae (32) to (34). The side chain β may be the same as or different from each other, and each represent a hydrogen atom or a linear, branched, or cyclic alkyl group having 1 to 20 carbon atoms, and an ether bond or a hydroxy group may be contained. In addition, the side chains α may bond to each other to form a ring.

$$*-[R^{300}-O-R^{301}] \qquad (32)$$

$$*-\left[R^{302}-O-R^{303}\overset{O}{\underset{\|}{C}}R^{304}\right] \qquad (33)$$

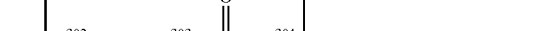

$$*-\left[R^{305}\overset{O}{\underset{\|}{C}}-O-R^{306}\right] \qquad (34)$$

Here, $R^{300}$, $R^{302}$, and $R^{305}$ each represent a linear or branched alkylene group having 1 to 4 carbon atoms. $R^{301}$ and $R^{304}$ each represent a hydrogen atom or a linear, branched or cyclic alkyl group having 1 to 20 carbon atoms, which may contain one or more hydroxy groups, ether bonds, ester bonds, and/or lactone rings. $R^{303}$ represents a single bond or a linear or branched alkylene group having 1 to 4 carbon atoms. $R^{306}$ represents a linear, branched or cyclic alkyl group having 1 to 20 carbon atoms, optionally containing one or more hydroxy groups, ether bonds, ester bonds, and/or lactone rings. In addition, * represents a bonding terminal.

Examples of the primary aliphatic amines include ammonia, methylamine, ethylamine, n-propylamine, isopropylamine, n-butylamine, isobutylamine, sec-butylamine, tertbutylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like.

Examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylethylenediamine, N,N-dimethylethylenediamine, N,N-dimethyltetraethylenepentamine, and the like.

Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, triacetylamine, N,N,N',N'-tetramethylethylenediamine, N,N,N',N'-tetramethylethylenediamine, N,N,N',N'-tetramethyltetraethylenepentamine, and the like.

Examples of the hybrid amines include dimethylethylamine, methylethylpropylamine, benzylamine, phenethylamine, benzyldimethylamine, and the like.

Examples of the aromatic amines and heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, and the like), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole, and the like), oxazole derivatives (for example, oxazole, isoxazole, and the like), thiazole derivatives (for example, thiazole, isothiazole, and the like), imidazole derivatives (for example, imidazole, 4-methylimidazole, 4-methyl-2-phenylimidazole, and the like), pyrazole derivatives, furazan derivatives, pyrroline derivatives (for example, pyrroline, 2-methyl-1-pyrroline, and the like), pyrrolidine derivatives (for example, pyrrolidine, N-methylpyrrolidine, pyrrolidinone, N-methylpyrrolidone, and the like), imidazoline derivatives, imidazolidine derivatives, pyridine derivatives (for example, pyridine, methylpyridine, ethylpyridine, propylpyridine, butylpyridine, 4-(1-butylpentyl) pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine, and the like), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline, 3-quinolinecarbonitrile, and the like), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, and the like.

Examples of the nitrogen-containing compounds having a carboxy group include aminobenzoic acid, indolecarboxylic acid, amino acid derivatives (for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine, and the like), and the like.

Examples of the nitrogen-containing compounds having a sulfonyl group include 3-pyridine sulfonic acid, pyridinium p-toluenesulfonate, and the like.

Examples of the nitrogen-containing compounds having a hydroxy group, the nitrogen-containing compounds having a hydroxyphenyl group, and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, N-(2-hydroxyethyl) isonicotinamide, and the like.

Examples of the amide derivatives include formamide, N-methylformamide, N,N-dimethylformamide, acetamide, N-methylacetamide, N,N-dimethylacetamide, propionamide, benzamide, and the like.

Examples of the imide derivatives include phthalimide, succinimide, maleimide, and the like.

Examples of the compound shown by the general formula (31) include, but are not limited to, tris[2-(methoxymethoxy) ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl) amine, tris(2-valeryloxyethyl)amine, tris(2-pivaloyloxyethyl)amine, N,N-bis(2-acetoxyethyl)2-(acetoxyacetoxy) ethylamine, tris(2-methoxycarbonyloxyethyl)amine, tris(2-tert-butoxycarbonyloxymethyl)amine, tris[2-(2-oxopropoxy)ethyl]amine, tris[2-(methoxycarbonylmethyl) oxyethyl]amine, tris[2-(tert-butoxycarbonylmethyloxy) ethyl]amine, tris[2-(cyclohexyloxycarbonylmethyloxy) ethyl]amine, tris(2-methoxycarbonylethyl)amine, tris(2-ethoxycarbonylethyl)amine, N,N-bis(2-hydroxyethyl)2-(methoxycarbonyl)ethylamine, N,N-bis(2-acetoxyethyl)2-(methoxycarbonyl)ethylamine, N,N-bis(2-hydroxyethyl)2-(ethoxycarbonyl)ethylamine, N,N-bis(2-acetoxyethyl)2-(ethoxycarbonyl)ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl)2-(tetrahydrofurfuryloxycarbonyl)ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl]ethylamine, N,N-bis(2-acetoxyethyl)2-[(2-oxotetrahydrofuran-3-yl)oxycarbonyl]ethylamine, N,N-bis(2-hydroxyethyl)2-(4-hydroxybutoxycarbonyl)ethylamine, N,N-bis(2-formyloxyethyl)2-(4-formyloxybutoxycarbonyl)ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone. One of these basic compounds can be used or a combination of two or more kinds thereof can be used.

In the inventive photosensitive resin composition, the formulation amount of the basic compound is preferably 0 to 3 parts by mass, particularly preferably 0.01 to 1 part by mass based on 100 parts by mass of the component (A) in view of sensitivity.

((J) Protective Amine Compound)

The inventive photosensitive resin composition can contain the component (J) protective amine compound. When the component (E) crosslinking agent has a high reactivity, there is concern that the component (E) and the amine compound react under room temperature when the amine compound is added directly, and the composition becomes viscous over time so that storage stability becomes degraded. On the other hand, an amine compound whose basicity is protected by a protecting group does not react with the component (E) crosslinking agent under room temperature. Therefore, it is possible to raise the storage stability of the photosensitive resin composition over time. In addition, since a base is only generated once heated, such an amine compound becomes a catalyst in a ring-closing reaction of an imide precursor, being a kind of component (A), or a crosslinking reaction between the component (A) resin and the component (E) crosslinking agent, so that a crosslinking reaction can be promoted effectively.

The component (J) protective amine compound can be any protective amine compound as long as it is a nitrogen-containing organic compound in which a group that is deprotected by heat or an acid is bonded to a nitrogen atom. In particular, the protective amine compound is not particularly limited as long as it has a carbamate structure represented by the following general formula (35) or (36).

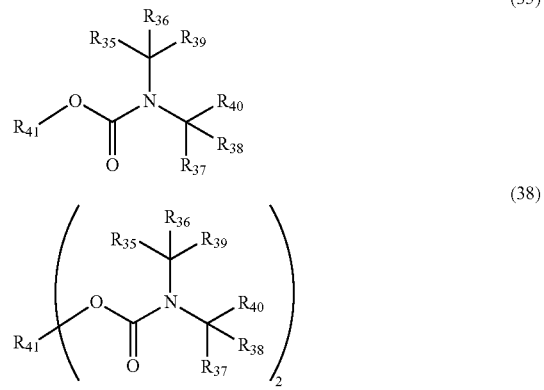

Here, in the formulae, $R_{35}$, $R_{36}$, $R_{37}$ and $R_{38}$ each independently represent hydrogen atom, an alkyl group having 1 to 8 carbon atoms optionally having a substituent, a cycloalkyl group having 3 to 8 carbon atoms optionally having a substituent, an alkoxyl group having 1 to 8 carbon atoms optionally having a substituent, an alkenyl group having 2 to 8 carbon atoms optionally having a substituent, an alkynyl group having 2 to 8 carbon atoms optionally having a substituent, an aryl group optionally having a substituent, or a heterocyclic group optionally having a substituent. $R_{39}$ and $R_{40}$ each independently represent hydrogen atom, an alkyl group having 1 to 8 carbon atoms optionally having a substituent, a cycloalkyl group having 3 to 8 carbon atoms optionally having a substituent, an alkoxyl group having 1 to 8 carbon atoms optionally having a substituent, an alkenyl group having 2 to 8 carbon atoms optionally having a substituent, an alkynyl group having 2 to 8 carbon atoms optionally having a substituent, an aryl group optionally having a substituent, a heterocyclic group optionally having a substituent, a single ring optionally having a substituent formed by bonding with each other, or a polycycle optionally having a substituent formed by bonding with each other. (Here, the total number of carbon atoms in the formula is 10 or less.)

$R_{41}$ represents an alkyl group having 1 to 12 carbon atoms optionally having a substituent, a cycloalkyl group having 3 to 12 carbon atoms optionally having a substituent, an alkenyl group having 2 to 12 carbon atoms optionally having a substituent, an alkynyl group having 2 to 12 carbon atoms optionally having a substituent, an aryl group optionally having, as a substituent, an alkyl group having 1 to 3 carbon atoms, an aralkyl group optionally having, as a substituent, an alkyl group having 1 to 3 carbon atoms, or a heterocyclic group optionally having a substituent. (Here, the total number of carbon atoms constituting $R_{41}$ is 12 or less.) Any substituent may be used as the substituent that the above groups optionally have, depending on the purpose.

Specific examples of the formulae (35) and (36) include the following: N-(isopropoxycarbonyl)-2,6-dimethylpiperidine, N-(isopropoxycarbonyl)-2,2,6,6-tetramethylpiperidine, N-(isopropoxycarbonyl)diisopropylamine, N-(isopropoxycarbonyl)pyrrolidine, N-(isopropoxycarbonyl)-2,5-dimethylpyrrolidine, N-(isopropoxycarbonyl)-azetidine, N-(1-ethylpropoxycarbonyl)-2,6-dimethylpiperidine, N-(1-ethylpropoxycarbonyl)-2,2,6,6-tetramethylpiperidine, N-(1-ethylpropoxycarbonyl)diisopropylamine, N-(1-ethylpropoxycarbonyl)pyrrolidine, N-(1-ethylpropoxycarbonyl)-2,5-dimethylpyrrolidine, N-(1-ethylpropoxycarbonyl)-azetidine, N-(1-propylbutoxycarbonyl)-2,6- dimethylpiperidine, N-(1-propylbutoxycarbonyl)-2,2,6,6-tetramethylpiperidine, N-(1-propylbutoxycarbonyl)diisopropylamine, N-(1-propylbutoxycarbonyl)pyrrolidine, N-(1-propylbutoxycarbonyl)-2,5-dimethylpyrrolidine, N-(1-propylbutoxycarbonyl)-azetidine, N-(cyclopentoxycarbonyl)-2,6-dimethylpiperidine, N-(cyclopentoxycarbonyl)-2,2,6,6-tetramethylpiperidine, N-(cyclopentoxycarbonyl)diisopropylamine, N-(cyclopentoxycarbonyl)pyrrolidine, N-(cyclopentoxycarbonyl)-2,5-dimethylpyrrolidine, N-(cyclopentoxycarbonyl)-azetidine, N-(cyclohexylcarbonyl)-2,6-dimethylpiperidine, N-(cyclohexylcarbonyl)-2,2,6,6-tetramethylpiperidine, N-(cyclohexylcarbonyl)diisopropylamine, N-(cyclohexylcarbonyl)pyrrolidine, N-(cyclohexylcarbonyl)-2,5-dimethylpyrrolidine, N-(cyclohexylcarbonyl)-azetidine, N-(tert-butoxycarbonyl)-2,6-dimethylpiperidine, N-(tert-butoxycarbonyl)-2,2,6,6-tetramethylpiperidine, N-(tert-butoxycarbonyl)diisopropylamine, N-(tert-butoxycarbonyl)pyrrolidine, N-(tert-butoxycarbonyl)-2,5-dimethylpyrrolidine, N-(tert-butoxycarbonyl)-azetidine, N-(benzyloxycarbonyl)-2,6-dimethylpiperidine, N-(benzyloxycarbonyl)-2,2,6,6-tetramethylpiperidine, N-(benzyloxycarbonyl)diisopropylamine, N-(benzyloxycarbonyl)pyrrolidine, N-(benzyloxycarbonyl)-2,5-dimethylpyrrolidine, N-(benzyloxycarbonyl)-azetidine, 1,4-bis(N,N'-diisopropylaminocarbonyloxy)cyclohexane, imidazole compounds disclosed in JP 5609815 B, and the like.

The protective amine compound according to the present embodiment is particularly preferably decomposed 100% at 200° C. or lower. In this manner, a basic compound can be generated more efficiently when heat-curing to promote imidization of a polyimide precursor, being a kind of component (A), or to promote the crosslinking reaction between the component (E) crosslinking agent and the component (A) resin. A base obtained by heating the protective amine compound and other decomposed products preferably have a boiling point of 200° C. or lower under 1 atmosphere (0.1 MPa). This is because the decomposed product can be volatilized in a low-temperature process from during coating, when the boiling point is 200° C. or lower. The lower limit of the boiling point of the decomposed product under 1 atmosphere is not particularly limited, but is preferably −150° C. or higher from the viewpoint of synthesizing the protective amine compound simply and conveniently.

One kind of the protective amine compound can be used or a combination of two or more kinds can be used. When 0 to 10 parts by mass of the protective amine compound is to be blended based on 100 parts by mass of the component (A) resin, a protective amine compound being a mixture with the formulation amount of 0.01 to 10 parts by mass, in particular, 0.01 to 5 parts by mass is suitable. When the formulation amount is 10 parts by mass or less, the alkali-solubility of the composition does not become lowered, so that lithography patterning property does not become degraded.

((K) Dissolution Inhibitor)

The inventive photosensitive resin composition can contain a component (K) dissolution inhibitor. Examples of the dissolution inhibitor include compounds having two or more phenolic hydroxy groups in a molecule, where an average of 0 to 100 mol % of the hydrogen atoms of the phenolic hydroxy groups are substituted with acid-labile groups as a whole; or compounds having a carboxy group in a molecule, where an average of 50 to 100 mol % of the hydrogen atoms of the carboxy groups are substituted with acid-labile groups as a whole. In addition, the compounds have a weight-average molecular weight of 100 to 1,000, preferably 150 to 800.

The degree of substitution of the hydrogen atoms in the phenolic hydroxy groups with the acid-labile groups is, on average, 0 mol % or higher, preferably 30 mol % or higher of all the phenolic hydroxy groups, and the upper limit of the degree is 100 mol %, more preferably 80 mol %. The degree of substitution of the hydrogen atoms in the carboxy groups with the acid-labile group is, on average, 50 mol % or higher, preferably 70 mol % or higher of all the carboxy groups, and the upper limit of the degree is 100 mol %.

In this case, compounds represented by the following formulae (K1) to (K14) are preferable as the compounds having two or more phenolic hydroxy groups or the compounds having a carboxy group.

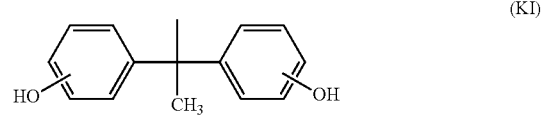

(K1)

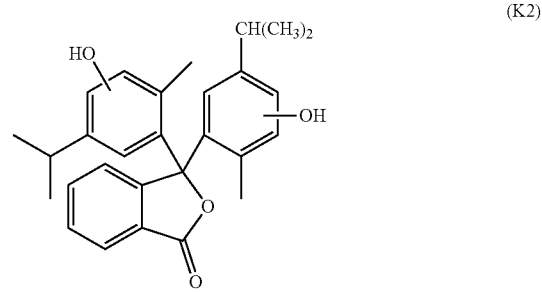

(K2)

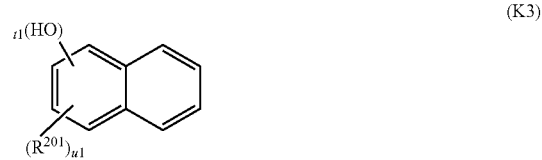

(K3)

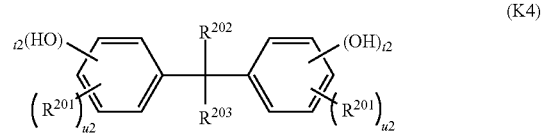

(K4)

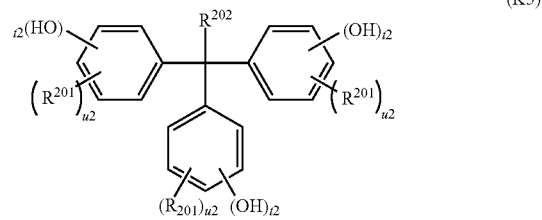

(K5)

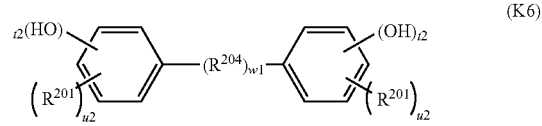

(K6)

-continued

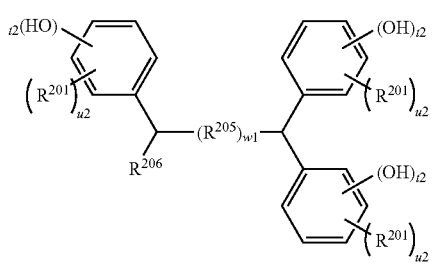

(K7)

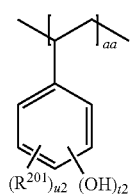

(K8)

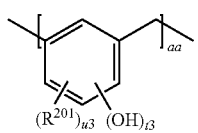

(K9)

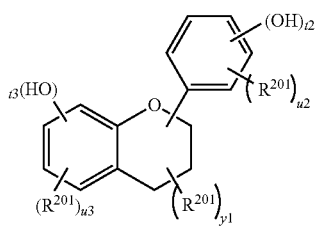

(K10)

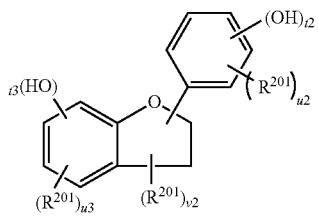

(K11)

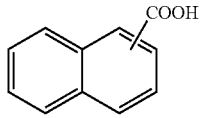

(K12)

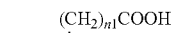

(K13)

(K14)

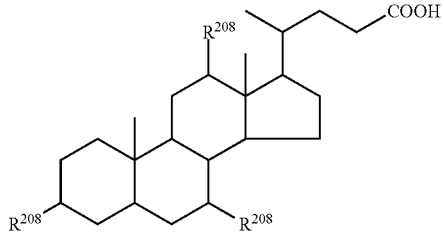

In the formulae, $R^{201}$ and $R^{202}$ each represent a hydrogen atom or a linear or branched alkyl group or alkenyl group having 1 to 8 carbon atoms. $R^{203}$ represents a hydrogen atom or a linear or branched alkyl group or alkenyl group having 1 to 8 carbon atoms. $R^{204}$ represents —$(CH_2)_{i1}$— (i1 represents an integer of 2 to 10), an arylene group having 6 to 10 carbon atoms, a carbonyl group, a sulfonyl group, an oxygen atom, or a sulfur atom. $R^{205}$ represents an alkylene group having 1 to 10 carbon atoms, an arylene group having 6 to 10 carbon atoms, a carbonyl group, a sulfonyl group, an oxygen atom, or a sulfur atom. $R^{206}$ represents a hydrogen atom, a linear or branched alkyl group or alkenyl group having 1 to 8 carbon atoms, or a phenyl group or a naphthyl group each substituted with a hydroxy group. $R^{208}$ represents a hydrogen atom or a hydroxy group. v1 represents an integer of 0 to 2, and v2 is 0 or 1. w1 and h1 are 0 or 1. t1, u1, t2, u2, t3, and u3 each satisfy t1+u1=8, t2+u2=5, and t3+u3=4, and are numbers such that there is at least one hydroxy group in each phenyl skeleton. "aa" is a number that gives a molecular weight of 100 to 1,000 to the compounds of the formulae (K8) and (K9).

The formulation amount of the dissolution inhibitor is preferably 0 to 50 parts by mass, more preferably 5 to 50 parts by mass, further preferably 5 to 20 parts by mass based on 100 parts by mass of the component (A) resin. One dissolution inhibiter can be used or a mixture of two or more thereof can be used. When the formulation amount is 0 parts by mass or more, resolution can be enhanced, and when the amount is 50 parts by mass or les, film loss of patterns does not occur, so that resolution does not become degraded.

((L) Radical Polymerizable Compound)

The inventive photosensitive resin composition can contain a component (L) radical polymerizable compound. A negative photosensitive resin composition can be obtained by combining the above-described polyimide precursor represented by the general formula (5), being the component (A), and a photoradical initiator. With such a composition, a favorable negative pattern can be obtained by crosslinking progressing, owing to radicals generated by exposure, between radical polymerizable compounds of the component (L), or when one or both of $R_a$ and $R_b$ in the general formula (5) are radical polymerizable groups shown by the general formula (6), between the resin of component (A) and the radical polymerizable compound. Since the component (L) radical polymerizable compound works as a crosslinking agent in this manner, a compound having two or more radical polymerizable unsaturated linking groups in one molecule is preferable.

As the compound having two or more radical polymerizable unsaturated linking groups in one molecule, a (meth) acrylic compound is preferable. Favorable examples include ethylene glycol diacrylate, ethylene glycol dimethacrylate, polyethylene glycol diacrylate (a number of each ethylene glycol unit: 2 to 20), polyethylene glycol dimethacrylate (a number of each ethylene glycol unit: 2 to 20), poly(1,2-propylene glycol) diacrylate, poly(1,2-propylene glycol) dimethacrylate, 1,6-hexanediol diacrylate, neopentyl glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, glycerol diacrylate, glycerol dimethacrylate, methylenebisacrylamide, N-methylolacrylamide, ethylene glycol diglycidyl ether-methacrylic acid adduct, glycerol diglycidyl ether-acrylic acid adduct, bisphenol A diglycidyl ether-acrylic acid adduct, bisphenol A diglycidyl ether-methacrylic acid adduct, N,N'-bis(2-methacryloyloxyethyl)urea, and the like, but the invention is not limited by these.

The component (L) is preferably formulated in an amount of 1 to 100 parts by mass, more preferably in the range of 3 to 50 parts by mass based on 100 parts by mass of the component (A). When the amount is in the range of 1 to 100 parts by mass, the intended effect can be sufficiently obtained, and there is no adverse effect on developing properties. As the copolymerizable monomer, one kind of the compound may be used, or several kinds may be used in admixture.

(Patterning Process)

Next, a patterning process using the inventive photosensitive resin composition will be described.

To form a pattern with the inventive photosensitive resin composition, a known lithography technique can be employed. For example, a photosensitive resin composition is applied by means of spin-coating (spin-coating method) onto a silicon wafer, a $SiO_2$ substrate, a SiN substrate, or a substrate where a pattern such as copper wiring has been formed. Then, the resultant is prebaked under conditions of 80 to 130° C. for 50 to 600 seconds or so to form a film of a photosensitive material with a thickness of 1 to 50 μm, preferably 1 to 30 μm, further preferably 5 to 20 μm.

In the spin-coating method, after the photosensitive resin composition is dispensed onto the silicon substrate by about 5 mL, the substrate is rotated, so that the photosensitive resin composition can be applied onto the substrate. In this event, by adjusting the rotation speed, the film thickness of the film of the photosensitive material on the substrate can be easily adjusted. Subsequently, the remaining solvent can be removed by prebaking.

Next, a mask for forming an intended pattern is placed over the film of the photosensitive material, and irradiated with a high-energy beam or an electron beam such as i line or g line having a wavelength of 190 to 500 nm at an exposure dose of about 1 to 5,000 $mJ/cm^2$, preferably about 100 to 2,000 $mJ/cm^2$.

Next, as necessary, a heat treatment after the exposure (post exposure bake (PEB)) may be carried out on a hot plate at 60 to 150° C. for 1 to 10 minutes, preferably at 80 to 120° C. for 1 to 5 minutes. In this manner, it is possible to promote a crosslinking reaction between the crosslinking group of the crosslinking agent and the crosslinking reaction point of the polymer by using, as a catalyst, an acid generated from the photo-acid generator by the exposure.

Thereafter, development is performed. With the above-described inventive photosensitive resin composition, it is possible to choose between alkaline development using an alkaline aqueous solution and development by an organic solvent depending on the type of the resin of the component (A).

An alkaline aqueous solution that can be suitably used in the development by an alkali is, for example, a 2.38% aqueous tetramethylhydroxy ammonium (TMAH) solution. The development can be carried out, for example, by an ordinary method such as a spray method or a paddle method, or by dipping the substrate in a developer. Thereafter, if necessary, cleaning, rinsing, drying, and so forth may be performed to obtain a resist film etc. having a desired pattern.

Meanwhile, as an organic solvent that can be suitably used in the development by an organic solvent, it is possible to use a solvent described above, used when preparing the inventive photosensitive resin composition. For example, ketones such as cyclohexanone and cyclopentanone, furthermore, glycols such as propylene glycol monomethyl ether, and the like are preferable. The development can be carried out, for example, by an ordinary method such as a spray method or a paddle method, or by dipping the substrate in a developer. Thereafter, if necessary, cleaning, rinsing, drying, and so forth may be performed to obtain a resist film etc. having a desired pattern.

(Method for Forming Cured Film)

Furthermore, the patterned film obtained by this patterning process is heated and post-cured at a temperature of 100 to 300° C., preferably 150 to 300° C., further preferably 180 to 250° C., by using an oven or a hot plate whereby a cured film can be formed. The post-curing temperature is preferably 100 to 300° C. from the viewpoints of increasing the crosslinking density of the photosensitive resin composition film, enabling removal of residual volatile components, as well as adhesive force to the substrate, heat resistance, strength, and also electric characteristics. The post-curing time can be 10 minutes to 10 hours.

The formed pattern is used for a protective film for covering wirings, circuits, substrates, and the like. These formed pattern and protective film have excellent insulating property and also exhibit excellent adhesive force onto a metal layer such as Cu in a wiring and a circuit to be covered, onto a metal electrode present on the substrate, or onto an insulating substrate such as SiN present in a wiring and a circuit to be covered. Furthermore, the formed pattern and protective film make it possible to remarkably improve the resolution performance for enabling a finer pattern formation, while having appropriate mechanical strength as a protective film.

(Cured Film)

The cured film thus obtained is excellent in adhesiveness to the substrate, heat resistance, electric characteristics, mechanical strength and chemical resistance to an alkaline peeling solution and the like. Moreover, a semiconductor device using the cured film as a protective film also has excellent reliability. Particularly, it is possible to prevent cracks in the temperature cycle test, whereby the cured film is suitably used as a protective film (interlayer insulation film or surface protective film) for electric and electronic parts, semiconductor devices, and the like.

That is, the present invention provides an interlayer insulation film and a surface protective film, being a cured film of the above-described photosensitive resin composition.

Because of the heat resistance, chemical resistance, and insulating property, the protective film is effective for an insulating film for a semiconductor device including rewiring use, an insulating film for a multilayer printed board, a solder mask, a cover lay film use, and the like.

Furthermore, the present invention provides an electronic component having the interlayer insulation film or the surface protective film.

Such an electronic component becomes excellent in reliability because the electronic component has the protective film (interlayer insulation film or surface protective film) having heat resistance, chemical resistance, and insulating property.

Specific examples of such electronic components include various electronic components such as: semiconductor integrated circuit devices such as ICs (Integrated Circuits) and LSIs (Large-Scale Integrated Circuits); photosemiconductor devices such as LEDs (Light Emitting Diodes), PDs (Photo Diodes), CCDs (Charged-Coupled Devices), and CMOSs (Complementary Metal-Oxide Semiconductors); sensor elements such as current sensor elements or magnetic sensor elements; and micromachines made by forming fine electromechanical mechanisms on a surface of a semiconductor substrate, so-called MEMS (Micro electro mechanical system) elements.

EXAMPLE

Hereinafter, the present invention will be specifically described with reference to Synthesis Examples, Comparative Synthesis Examples, Examples, and Comparative Examples. However, the present invention is not limited by the following examples.

I. Synthesis of Resin

In the following Synthesis Examples, chemical structures and names of the used compounds are shown below.

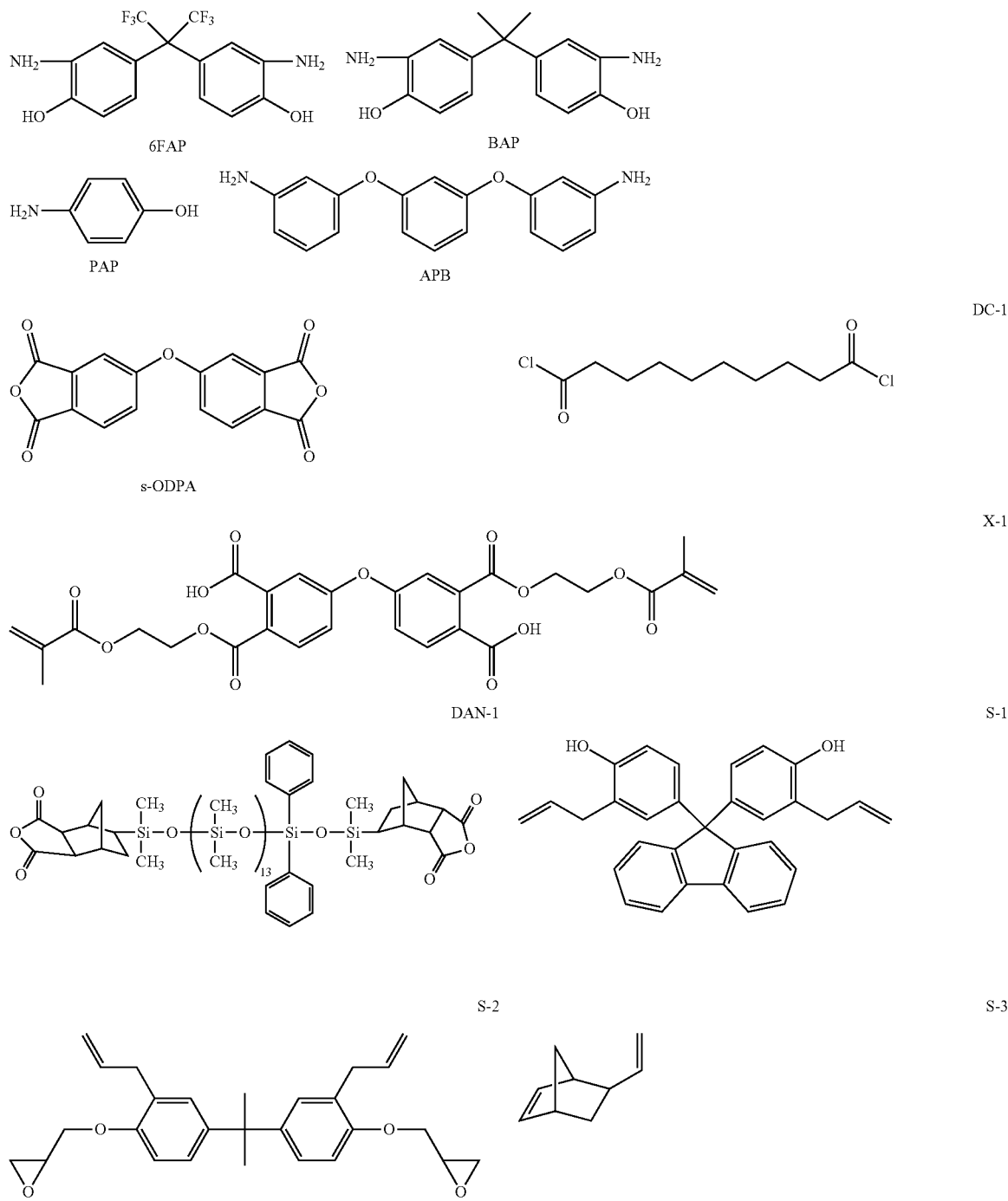

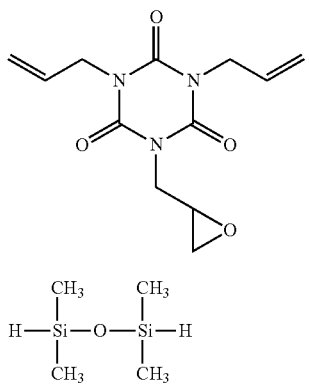

S-4

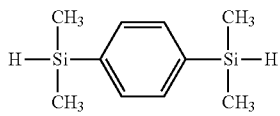

S-5

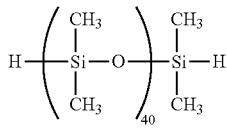

S-6

$$H{\left({\underset{\underset{CH_3}{|}}{\overset{\overset{CH_3}{|}}{Si}}}-O\right)}_{40}{\underset{\underset{CH_3}{|}}{\overset{\overset{CH_3}{|}}{Si}}}-H$$

S-7

Synthesis Example 1 Synthesis of Polyimide Resin (A1)

Into a 1-L flask provided with a stirrer and a thermometer, 30 g (81.9 mmol) of 2,2-bis(3-amino-4-hydroxyphenyl)hexafluoropropane (6FAP), 0.9 g (8.6 mmol) of 4-aminophenol (PAP), and 125 g of N-methyl-2-pyrrolidone were added, followed by dissolving by stirring at room temperature. Next, under room temperature, a solution in which 26.7 g (86.2 mmol) of 3,3',4,4'-oxydiphthalic dianhydride (s-ODPA) was dissolved in 270 g of N-methyl-2-pyrrolidone was dropped thereto, followed by stirring for 3 hours under room temperature after dropping. Thereafter, 40 g of xylene was added to the reaction liquid, followed by heating and refluxing for 3 hours while removing water generated at 170° C. outside the system. After cooling to room temperature, the reaction liquid was dropped into 2 L of ultrapure water under stirring, a precipitate was filtered to be washed appropriately with water, followed by drying under reduced pressure at 40° C. for 48 hours. Thus, a polyimide resin (A1) was obtained. A molecular weight of the polymer was measured by GPC. A weight-average molecular weight was 35,000 in terms of polystyrene.

Synthesis Example 2 Synthesis of Polyimide Resin (A2)

A polyimide resin (A2) was obtained by the same method as Synthesis Example 1, except that the 30 g (81.9 mmol) of 2,2-bis(3-amino-4-hydroxyphenyl)hexafluoropropane (6FAP) was changed to 21.2 g (81.9 mmol) of 2,2-bis(3-amino-4-hydroxyphenyl)propane (BAP). A molecular weight of the polymer was measured by GPC. A weight-average molecular weight was 34,000 in terms of polystyrene.

Synthesis Example 3 Synthesis of Polyamide-Imide Resin (A3)

Into a 500-mL flask provided with a stirrer and a thermometer, 28.5 g (77.8 mmol) of 2,2-bis(3-amino-4-hydroxyphenyl)hexafluoropropane (6FAP), 0.9 g (8.2 mmol) of 4-aminophenol (PAP), and 118 g of N-methyl-2-pyrrolidone were added, followed by dissolving by stirring at room temperature. Next, under room temperature, a solution in which 19.0 g (61.4 mmol) of 3,3',4,4'-oxydiphthalic dianhydride (s-ODPA) was dissolved in 192 g of N-methyl-2-pyrrolidone was dropped thereto, followed by stirring for 3 hours under room temperature after dropping. Thereafter, 40 g of xylene was added to the reaction liquid, followed by heating and refluxing for 3 hours while removing water generated at 170° C. outside the system. After cooling to room temperature, 3.2 g (41.0 mmol) of pyridine was added thereto, and 4.9 g (20.5 mmol) of sebacoyl dichloride (DC-1) was dropped thereto so as to keep the temperature to 5° C. or lower. After completion of the dropping, the temperature was returned to room temperature, and the reaction liquid was dropped into 2 L of ultrapure water under stirring. A precipitate was filtered to be washed appropriately with water, followed by drying under reduced pressure at 40° C. for 48 hours. Thus, a polyamide-imide resin (A3) was obtained. A molecular weight of the polymer was measured by GPC. A weight-average molecular weight was 35,000 in terms of polystyrene.

Synthesis Example 4 Synthesis of Polyamide Resin (A4)

Into a 500-mL flask provided with a stirrer and a thermometer, 28.5 g (77.8 mmol) of 2,2-bis(3-amino-4-hydroxyphenyl)hexafluoropropane (6FAP), 0.9 g (8.2 mmol) of 4-aminophenol (PAP), and 118 g of N-methyl-2-pyrrolidone were added, followed by dissolving by stirring at room temperature. Next, 13.0 g (163.8 mmol) of pyridine was added thereto, and 19.6 g (81.9 mmol) of sebacoyl dichloride (DC-1) was dropped thereto so as to keep the temperature to 5° C. or lower. After completion of the dropping, the temperature was returned to room temperature, and the reaction liquid was dropped into 2 L of ultrapure water under stirring. A precipitate was filtered to be washed appropriately with water, followed by drying under reduced pressure at 40° C. for 48 hours. Thus, a polyamide resin (A4) was obtained. A molecular weight of the polymer was measured by GPC. A weight-average molecular weight was 38,000 in terms of polystyrene.

Synthesis Example 5 Synthesis of Tetracarboxylic Diester Compound (X-1)

Into a 3-L flask provided with a stirrer and a thermometer, 100 g (322 mmol) of 3,3',4,4'-oxydiphthalic dianhydride (s-ODPA), 65.2 g (644 mmol) of triethylamine, 39.3 g (322 mmol) of N,N-dimethyl-4-aminopyridine, and 400 g of γ-butyrolactone were added, under stirring at room temperature, 83.8 g (644 mmol) of hydroxyethylmethacrylate (HEMA) was dropped thereto, followed by stirring for 24 hours under room temperature. After that, 370 g of a 10% aqueous solution of hydrochloric acid was dropped under ice cooling to stop the reaction. To the reaction liquid, 800 g of 4-methyl-2-pentanone was added to sample an organic layer, followed by washing 6 times with 600 g of water. A solvent of the obtained organic layer was distilled and 180 g of a tetracarboxylic diester compound (X-1) was obtained.

Synthesis Example 6 Synthesis of Polyimide Precursor (A5)

Into a 1-L flask provided with a stirrer and a thermometer, 57.1 g (100 mmol) of (X-1) and 228 g of N-methyl-2-pyrrolidone were added, followed by dissolving by stirring at room temperature. Next, under ice cooling, 24.4 g (205 mmol) of thionyl chloride was dropped thereto so as to keep the reaction solution temperature to 10° C. or lower. After completion of the dropping, the solution was stirred under ice cooling for 2 hours. Subsequently, a solution obtained by dissolving 34.8 g (95 mmol) of 2,2-bis(3-amino-4-hydroxy-phenyl)hexafluoropropane (6FAP), 1.1 g (10 mmol) of 4-aminophenol (PAP), and 32.4 g (410 mmol) of pyridine with 144 g of N-methyl-2-pyrrolidone was dropped thereto under ice cooling so as to keep the reaction solution temperature to 10° C. or lower. After completion of the dropping, the temperature was returned to room temperature, and the reaction liquid was dropped into 3 L of water under stirring. A precipitate was filtered to be washed appropriately with water, followed by drying under reduced pressure at 40° C. for 48 hours. Thus, a polyimide precursor (A5) was obtained. A molecular weight of the polymer was measured by GPC. A weight-average molecular weight was 36,000 in terms of polystyrene.

Synthesis Example 7 Synthesis of Polyimide Resin (A6)

Into a 1-L flask provided with a stirrer and a thermometer, 27.5 g (75 mmol) of 2,2-bis(3-amino-4-hydroxyphenyl) hexafluoropropane (6FAP), 5.8 g (20 mmol) of 1,3-bis(3-aminophenoxy)benzene (APB), 1.1 g (10 mmol) of 4-aminophenol (PAP), and 138 g of γ-butyrolactone were added, followed by dissolving by stirring at room temperature. Next, under room temperature, a solution in which 12.4 g (40 mmol) of 3,3',4,4'-oxydiphthalic dianhydride (s-ODPA) and 110.5 g of acid anhydride-modified siloxane (DAN-1) were dissolved in 492 g of γ-butyrolactone was dropped thereto, followed by stirring for 3 hours under room temperature after dropping. Thereafter, 40 g of xylene was added to the reaction liquid, followed by heating and refluxing for 3 hours while removing water generated at 170° C. outside the system. After cooling to room temperature, 1.7 g (22.5 mmol) of glycidol was added to the polyimide solution, and heated at 120° C. for 3 hours. After cooling to room temperature, the reaction liquid was dropped into 4 L of ultrapure water under stirring. A precipitate was filtered to be washed appropriately with water, followed by drying under reduced pressure at 40° C. for 48 hours. Thus, a polyimide resin (A6) was obtained. A molecular weight of the polymer was measured by GPC. A weight-average molecular weight was 20,000 in terms of polystyrene.

Synthesis Example 8 Synthesis of Resin Containing Siloxane Skeleton (A7)

In a 10-L flask equipped with a stirrer, a thermometer, a nitrogen purge system, and a reflux condenser, 624 g (1.45 mol) of the compound (S-1) was dissolved in 2,500 g of toluene. Subsequently, 261.2 g (0.62 mol) of the compound (S-2), 1,214.4 g (0.40 mol) of the compound (S-7), and 13.3 g (0.10 mol) of the compound (S-6) were added thereto, and the mixture was heated at 60° C. Thereafter, 3.5 g of carbon carried platinum catalyst (5 mass %) was added thereto, and after confirming that the internal reaction temperature was raised to 65 to 67° C., the mixture was further heated for 3 hours at 90° C., and was cooled again to 60° C. Then, 3.5 g of carbon carried platinum catalyst (5 mass %) was added thereto, and 285.2 g (1.47 mol) of the compound (S-5) was dropped into the flask over 1 hour. In this event, the temperature inside the flask was raised to 65 to 67° C. After the dropping, the resultant was further aged at 90° C. for 3 hours and cooled to room temperature. Then, 2,800 g of methyl isobutyl ketone was added thereto, and the reaction solution was filtered under pressure through a filter to remove the platinum catalyst. Furthermore, 1,300 g of pure water was added to the obtained solution of resin containing a siloxane skeleton, and the mixture was stirred and allowed to stand for liquid separation to remove the lower aqueous layer. This liquid separation and water-washing operation was repeated 6 times. The solvent in the resulting solution of resin containing a siloxane skeleton was distilled off under reduced pressure. Thus a resin containing a siloxane skeleton (A7) was obtained. A molecular weight of the polymer was measured by GPC. A weight-average molecular weight was 31,000 in terms of polystyrene.

Synthesis Example 9 Synthesis of Resin Containing Siloxane Skeleton (A8)

Into a 10-L flask equipped with a stirrer, a thermometer, a nitrogen purge system, and a reflux condenser, 26.5 g (0.10 mol) of the compound (S-4), 108.9 g (0.90 mol) of the compound (S-3), 151.3 g (0.05 mol) of the compound (S-7), and 2,000 g of toluene were added and heated at 60° C. Thereafter, 1.0 g of carbon carried platinum catalyst (5 mass %) was added thereto, and after confirming that the internal reaction temperature was raised to 63 to 65° C., the mixture was further heated for 3 hours at 90° C., and was cooled again to 60° C. Then, 1.0 g of carbon carried platinum catalyst (5 mass %) was added thereto, and 184.3 g (0.95 mol) of the compound (S-5) was dropped into the flask over 1 hour. In this event, the temperature inside the flask was raised to 65 to 67° C. After the dropping, the resultant was further aged at 90° C. for 3 hours and cooled to room temperature. Then, 2,000 g of methyl isobutyl ketone was added thereto, and the reaction solution was filtered under pressure through a filter to remove the platinum catalyst. Furthermore, 1,000 g of pure water was added to the obtained solution of resin containing a siloxane skeleton, and the mixture was stirred and allowed to stand for liquid separation to remove the lower aqueous layer. This liquid separation and water-washing operation was repeated 6 times. The solvent in the resulting solution of resin containing a siloxane skeleton was distilled off under reduced pressure. Thus, a resin containing a siloxane skeleton (A8) was obtained. A molecular weight of the polymer was measured by GPC. A weight-average molecular weight was 15,000 in terms of polystyrene.

II. Preparation of Photosensitive Resin Composition

A polymer synthesized in the Synthesis Example 1 to Synthesis Example 9 was used as a base resin. With the compositions and formulation amounts given in Table 1, 30 mass % resin compositions in terms of resin were prepared. Thereafter, after stirring, mixing, and dissolving, microfiltering was applied with a Teflon (registered trade mark) 0.5-μm filter to obtain a photosensitive resin composition. In the Table, PGMEA of a solvent represents propylene glycol monomethyl ether acetate, GBL represents γ-butyrolactone, and CPn represents cyclopentanone.

TABLE 1

| | Resin Component (A) | Photo-sensitizer Component (B) | Surfactant Component (C) | Crosslinking agent Component (E) | | Solvent Component (D) | | Others Component (L) | Others Component (I) |
|---|---|---|---|---|---|---|---|---|---|
| Photosensitive resin composition 1 | A1 100 parts by mass | B1 15 parts by mass | C-1 0.02 parts by mass | | | PGMEA 207 parts by mass | GBL 23 parts by mass | | |
| Photosensitive resin composition 2 | A1 100 parts by mass | B1 15 parts by mass | C-1 0.02 parts by mass | E1 10 parts by mass | E2 15 parts by mass | PGMEA 207 parts by mass | GBL 23 parts by mass | | |
| Photosensitive resin composition 3 | A1 100 parts by mass | B1 15 parts by mass | C-2 0.02 parts by mass | E1 10 parts by mass | E2 15 parts by mass | PGMEA 207 parts by mass | GBL 23 parts by mass | | |
| Photosensitive resin composition 4 | A1 100 parts by mass | B1 15 parts by mass | C-9 0.02 parts by mass | E1 10 parts by mass | E2 15 parts by mass | PGMEA 207 parts by mass | GBL 23 parts by mass | | |
| Photosensitive resin composition 5 | A1 100 parts by mass | B1 15 parts by mass | C-14 0.02 parts by mass | E1 10 parts by mass | E2 15 parts by mass | PGMEA 207 parts by mass | GBL 23 parts by mass | | |
| Photosensitive resin composition 6 | A1 100 parts by mass | B1 15 parts by mass | C-15 0.02 parts by mass | E1 10 parts by mass | E2 15 parts by mass | PGMEA 207 parts by mass | GBL 23 parts by mass | | |
| Photosensitive resin composition 7 | A2 100 parts by mass | B1 15 parts by mass | C-9 0.02 parts by mass | E1 10 parts by mass | E2 15 parts by mass | PGMEA 23 parts by mass | GBL 207 parts by mass | | |
| Photosensitive resin composition 8 | A3 100 parts by mass | B1 15 parts by mass | C-9 0.02 parts by mass | E1 10 parts by mass | E2 15 parts by mass | PGMEA 207 parts by mass | GBL 23 parts by mass | | |
| Photosensitive resin composition 9 | A4 100 parts by mass | B1 15 parts by mass | C-9 0.02 parts by mass | E1 10 parts by mass | E2 15 parts by mass | PGMEA 207 parts by mass | GBL 23 parts by mass | | |
| Photosensitive resin composition 10 | A5 100 parts by mass | B2 15 parts by mass | C-5 0.02 parts by mass | | | PGMEA 207 parts by mass | GBL 23 parts by mass | L1 15 parts by mass | |
| Photosensitive resin composition 11 | A1 100 parts by mass | B3 15 parts by mass | C-9 0.02 parts by mass | E3 5 parts by mass | E2 10 parts by mass | PGMEA 207 parts by mass | GBL 23 parts by mass | | I1 1 part by mass |
| Photosensitive resin composition 12 | A6 100 parts by mass | B3 15 parts by mass | C-9 0.02 parts by mass | E3 5 parts by mass | E2 10 parts by mass | CPn 207 parts by mass | GBL 23 parts by mass | | I1 1 part by mass |
| Photosensitive resin composition 13 | A7 100 parts by mass | B3 15 parts by mass | C-9 0.02 parts by mass | E3 5 parts by mass | | CPn 230 parts by mass | | | I1 1 part by mass |
| Photosensitive resin composition 14 | A8 100 parts by mass | B4 15 parts by mass | C-9 0.02 parts by mass | | E2 15 parts by mass | CPn 230 parts by mass | | | |
| Comparative photosensitive resin composition 1 | A1 100 parts by mass | B1 15 parts by mass | C-20 0.02 parts by mass | E1 10 parts by mass | E2 15 parts by mass | PGMEA 207 parts by mass | GBL 23 parts by mass | | |
| Comparative photosensitive resin composition 2 | A2 100 parts by mass | B1 15 parts by mass | C-20 0.02 parts by mass | E1 10 parts by mass | E2 15 parts by mass | PGMEA 23 parts by mass | GBL 207 parts by mass | | |
| Comparative photosensitive resin composition 3 | A7 100 parts by mass | B3 15 parts by mass | C-20 0.02 parts by mass | E3 5 parts by mass | | CPn 230 parts by mass | | | I1 1 part by mass |

In the Table 1, the details of each component are as follows.

Component (B)

B1

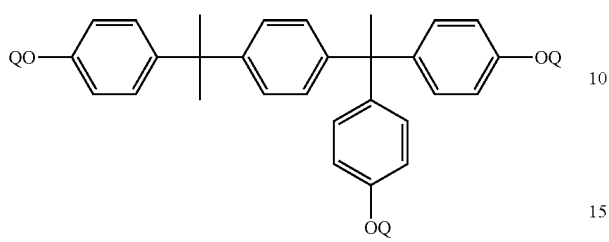

In the formula, Q represents a 1,2-naphthoquinone diazide sulfonyl group represented by the following formula (37) or a hydrogen atom, and 90% of Qs are substituted with the 1,2-naphthoquinone diazide sulfonyl group represented by the following formula (37).

(37)

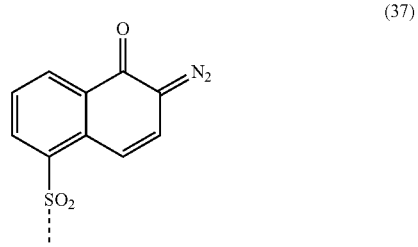

B2: N-1919 manufactured by ADEKA CORPORATION

B3

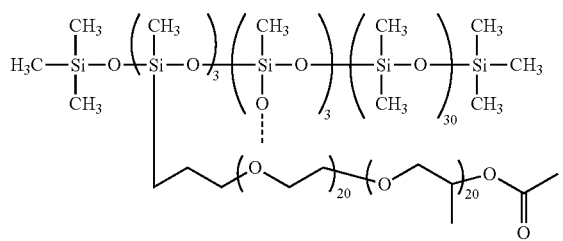

B4

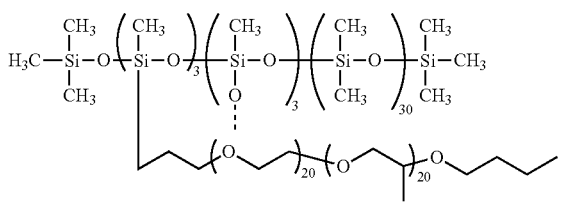

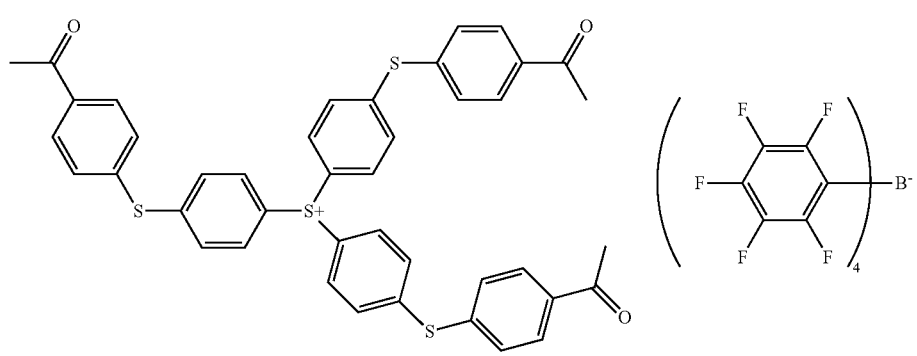

Component (C)

(C-1) (C-2)

(C-5)
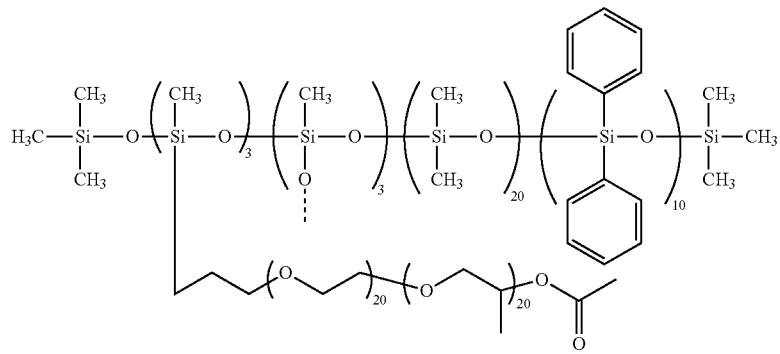
(C-9) (C-14)
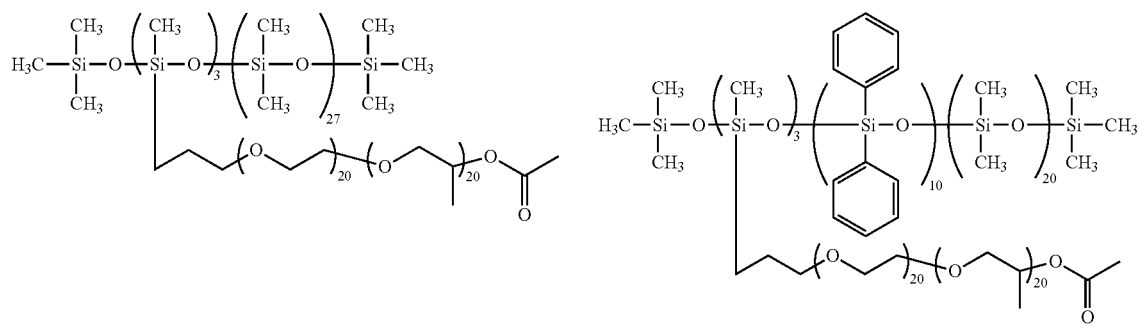
(C-15)
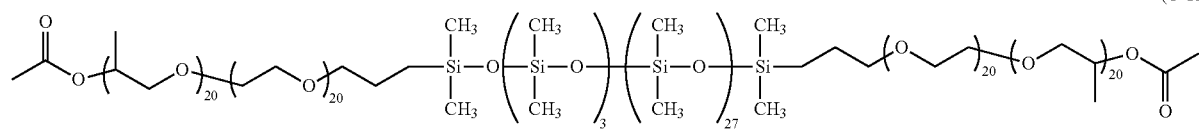
C-20: FC-430 (perfluorooctanesulfonic acid derivative) manufactured by Sumitomo 3M Limited
E2: EP4000L manufactured by ADEKA CORPORATION
Component (E)
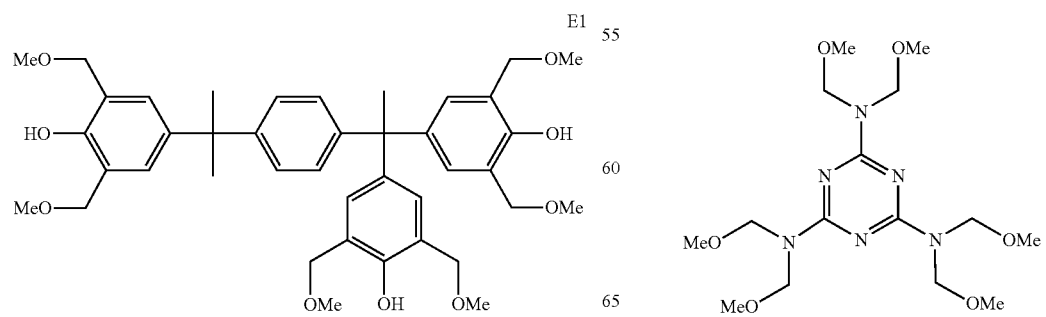

Component (L)
L1: diethylene glycol diacrylate

Component (I)

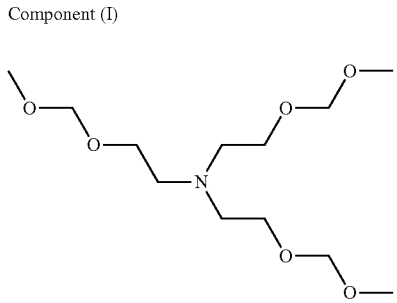

I1

III. Pattern Formation

By rotating a substrate after dispensing each of the photosensitive resin compositions 1 to 14, and comparative photosensitive resin compositions 1 to 3 by 5 mL on an 8-inch silicon substrate, that is, by a spin-coating method, the photosensitive resin composition was applied in such a manner that a film thickness was 10 μm after heating in the post-curing performed after patterning. That is, by considering in advance that after the post-curing step, the film thickness decreases, the rotational rate during coating was adjusted so that a finishing film thickness after the post-curing was 10 μm. Next, prebaking was performed on a hot plate at 100° C. for 2 minutes.

The film thickness of the obtained coating film was measured at 29 points at 6-mm intervals in a diametrical direction of the substrate by using a film thickness meter RE-3100 manufactured by Dainippon Screen Mfg. Co., Ltd. The average film thickness and, as coating uniformity, the variation in film thickness has been shown by range in Table 2.

In addition, the number of defects of 100 nm or more in the obtained coating film was measured by using a defect inspection system Surfscan SP2 manufactured by KLA-Tencor Corporation, and the results have been shown in Table 2.

Next, i line exposure and pattern formation were carried out using an i-line stepper NSR-2205i11 manufactured by Nikon Corporation. In the pattern formation, masks for a positive pattern and a negative pattern were appropriately used in accordance with the photosensitive resin composition used. The mask has a pattern which can form a hole of 20 μm in lengthwise and breadthwise arrangement of 1:1, and can form a hole pattern of 10 μm in increments from 50 μm to 20 μm, 5 μm in increments from 20 μm to 10 μm, and 1 μm in increments from 10 μm to 1 μm.

Next, those subjected to the heating (baking after exposure) were heated under the conditions as shown in the following Table 2.

In the development step, an alkaline aqueous solution was used as a developer, and a 2.38% aqueous tetramethylammonium hydroxide (TMAH) solution was used, or an organic solvent was used as a developer, and cyclopentanone (CPn) was used. The results are shown in Table 2. When a 2.38% aqueous tetramethylammonium hydroxide (TMAH) solution was used, a 1-minute paddle development was carried out three times, and then rinsing with ultrapure water was carried out. When cyclopentanone (CPn) was used, a 1-minute paddle development was carried out twice, and then rinsing with isopropyl alcohol was carried out.

Subsequently, the pattern on the substrate obtained was post-cured by using an oven at 200° C. for 2 hours while purging with nitrogen.

Next, in order to observe the shape of the obtained hole pattern, each substrate was cut out and the shape of the hole pattern of 10 μm was observed using a scanning electron microscope (SEM).

The pattern shape of the hole was evaluated according to the following criteria, and the evaluation results are shown in Table 2.

Good: those in which a rectangular or forward tapered shape (a shape in which the dimension of the hole upper part is larger than that of the bottom part) was observed in the hole Not good: those in which an inversely tapered shape (a shape in which the dimension of the hole upper part is smaller than that of the bottom part), an overhang shape (a shape in which the hole upper part is protruded), remarkable film loss, or residue at the bottom of the hole was observed

TABLE 2

| | Composition | Average film thickness (μm) | Film thickness range (μm) | Number of defects | Pattern | Developer | Baking after exposure | Hole pattern shape |
| --- | --- | --- | --- | --- | --- | --- | --- | --- |
| Example 1 | Photosensitive resin composition 1 | 12.1 | 0.3 | 23 | Positive | TMAH | None | Good |
| Example 2 | Photosensitive resin composition 2 | 12.2 | 0.4 | 30 | Positive | TMAH | None | Good |
| Example 3 | Photosensitive resin composition 3 | 12.1 | 0.3 | 27 | Positive | TMAH | None | Good |
| Example 4 | Photosensitive resin composition 4 | 12.0 | 0.3 | 25 | Positive | TMAH | None | Good |
| Example 5 | Photosensitive resin composition 5 | 12.2 | 0.4 | 31 | Positive | TMAH | None | Good |
| Example 6 | Photosensitive resin composition 6 | 12.1 | 0.5 | 26 | Positive | TMAH | None | Good |
| Example 7 | Photosensitive resin composition 7 | 12.0 | 0.3 | 29 | Positive | TMAH | None | Good |

TABLE 2-continued

| | Composition | Average film thickness (μm) | Film thickness range (μm) | Number of defects | Pattern | Developer | Baking after exposure | Hole pattern shape |
|---|---|---|---|---|---|---|---|---|
| Example 8 | Photosensitive resin composition 8 | 12.1 | 0.3 | 28 | Positive | TMAH | None | Good |
| Example 9 | Photosensitive resin composition 9 | 12.0 | 0.4 | 27 | Positive | TMAH | None | Good |
| Example 10 | Photosensitive resin composition 10 | 12.2 | 0.4 | 30 | Negative | CPn | None | Good |
| Example 11 | Photosensitive resin composition 11 | 12.0 | 0.3 | 25 | Negative | TMAH | 100° C. × 120 sec | Good |
| Example 12 | Photosensitive resin composition 12 | 12.2 | 0.2 | 25 | Negative | TMAH | 100° C. × 120 sec | Good |
| Example 13 | Photosensitive resin composition 13 | 12.0 | 0.2 | 29 | Negative | CPn | 100° C. × 120 sec | Good |
| Example 14 | Photosensitive resin composition 14 | 12.1 | 0.4 | 32 | Negative | CPn | 100° C. × 120 sec | Good |
| Comparative Example 1 | Comparative photosensitive resin composition 1 | 12.0 | 0.7 | 82 | Positive | TMAH | None | Good |
| Comparative Example 2 | Comparative photosensitive resin composition 2 | 12.2 | 0.8 | 79 | Positive | TMAH | None | Good |
| Comparative Example 3 | Comparative photosensitive resin composition 3 | 12.1 | 0.3 | 87 | Negative | CPn | 100° C. × 120 sec | Good |

As shown in Table 2, the inventive photosensitive resin composition showed favorable pattern shapes with positive and negative patterns, and with development with an alkaline aqueous solution and development with an organic solvent. It was also observed that the inventive photosensitive resin composition has a smaller film thickness range, excellence in film thickness uniformity, and fewer coating defects compared with the Comparative Examples, in which the conventional fluorine-based surfactant was used.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A photosensitive resin composition comprising:
   (A) a resin;
   (B) a photosensitizer;
   (C) a surfactant comprising a structural unit represented by the following average composition formula (1); and
   (D) a solvent,

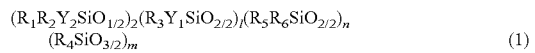

$$(R_1R_2Y_2SiO_{1/2})_2(R_3Y_1SiO_{2/2})_l(R_5R_6SiO_{2/2})_n \\ (R_4SiO_{3/2})_m \quad (1)$$

wherein $Y_1$ and $Y_2$ each independently represent a hydrogen atom, a methyl group, a phenyl group, or a group represented by the following general formula (2), at least one of $Y_1$ and $Y_2$ is a group represented by the following general formula (2), $R_1$ to $R_6$ are monovalent hydrocarbon groups that may be the same or different and optionally contain a heteroatom, having 1 to 20 carbon atoms, "l" and "n" are each independently integers of 1 to 100, and "m" is an integer of 0 to 100,

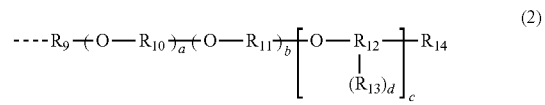

$$\cdots\cdots R_9\text{---}(\text{O}\text{---}R_{10})_a(\text{O}\text{---}R_{11})_b\left[\text{O}\text{---}R_{12}\atop (R_{13})_d\right]_c R_{14} \quad (2)$$

wherein a dotted line represents a bond, $R_9$, $R_{10}$, and $R_{11}$ each independently represent a linear or branched alkylene group having 2 to 10 carbon atoms where $R_{10}$ is different from $R_{11}$, $R_{12}$ represents a trivalent hydrocarbon group having 2 to 10 carbon atoms, $R_{13}$ represents a structure having one or more repeating units selected from ($OR_{10}$), ($OR_{11}$), and ($OR_{12}$), $R_{14}$ represents a linear or branched alkyl ester group having 2 to 10 carbon atoms, "a" represents an integer of 1 to 50, "b" represents an integer of 0 to 50, "c" represents an integer of 0 to 50, "d" represents an integer of 1 to 20; and —$OR_{10}$—, —$OR_{11}$—, and —$OR_{12}(R_{13})$— may be in a random order.

2. The photosensitive resin composition according to claim 1, wherein "a" represents an integer of 10 to 30, "b" represents an integer of 10 to 30, and "c" represents an integer of 0 to 20 in the general formula (2).

3. The photosensitive resin composition according to claim 1, further comprising (E) one or more crosslinking agents selected from an amino condensate modified by formaldehyde or formaldehyde-alcohol; a phenol compound having two or more methylol groups or alkoxymethylol groups by average in one molecule; a compound in which a hydrogen atom of a hydroxy group of a polyvalent phenol is substituted with a glycidyl group; a compound in which a hydrogen atom of a hydroxy group of a polyvalent phenol is substituted with a substituent represented by the following formula (E-1); and a compound containing two or more nitrogen atoms having a glycidyl group represented by the following formula (E-2),

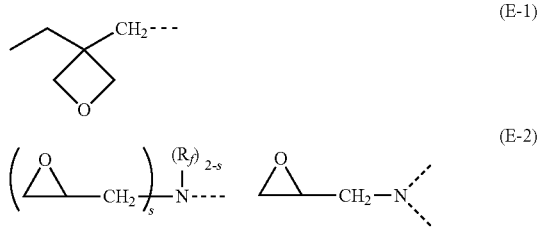

wherein a dotted line represents a bond, $R_f$ represents a linear, branched or cyclic alkyl group having 1 to 6 carbon atoms, and "s" represents 1 or 2.

4. The photosensitive resin composition according to claim 1, wherein the resin (A) is at least one kind selected from polyamide, polyamide-imide, polyimide, a polyimide precursor, polybenzoxazole, a polybenzoxazole precursor, and a resin containing a siloxane skeleton.

5. The photosensitive resin composition, wherein the resin according to claim 4 has a weight-average molecular weight of 3,000 to 500,000.

6. The photosensitive resin composition according to claim 1, wherein the photosensitizer (B) is a photo-acid generator.

7. The photosensitive resin composition according to claim 6, wherein the photo-acid generator is a compound having a quinonediazide structure.

8. The photosensitive resin composition according to claim 1, wherein the photosensitizer (B) is a photoradical initiator.

9. A patterning process comprising:
 (I) forming a photosensitive material film by coating a substrate with the photosensitive resin composition according to claim 1;
 (II) subsequently, after a heat treatment, exposing the photosensitive material film with a high-energy beam having a wavelength of 190 to 500 nm or an electron beam via a photomask; and
 (III) developing with a developer of an alkaline aqueous solution or an organic solvent.

10. The patterning process according to claim 9, further comprising a heating step after the exposure between the exposure step and the development step.

11. A method for forming a cured film comprising:
 further heating and post-curing, at a temperature of 100 to 300° C., a film on which a pattern is formed by the patterning process according to claim 9.

12. A method for forming a cured film comprising:
 further heating and post-curing, at a temperature of 100 to 300° C., a film on which a pattern is formed by the patterning process according to claim 10.

13. An interlayer insulation film, being a cured film of the photosensitive resin composition according to claim 1.

14. A surface protective film, being a cured film of the photosensitive resin composition according to claim 1.

15. An electronic component, having the interlayer insulation film according to claim 13.

16. An electronic component, having the surface protective film according to claim 14.

* * * * *